(12) United States Patent
Inoue et al.

(10) Patent No.: US 9,553,370 B2
(45) Date of Patent: Jan. 24, 2017

(54) ANTENNA MODULE AND METHOD FOR MANUFACTURING THE SAME

(71) Applicant: Nitto Denko Corporation, Osaka (JP)

(72) Inventors: Masami Inoue, Ibaraki (JP); Masayuki Hodono, Ibaraki (JP); Mitsuru Honjo, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 60 days.

(21) Appl. No.: 14/208,706

(22) Filed: Mar. 13, 2014

(65) Prior Publication Data

US 2015/0270620 A1   Sep. 24, 2015

(30) Foreign Application Priority Data

Mar. 15, 2013   (JP) .................................. 2013-053535

(51) Int. Cl.
*H01Q 13/10* (2006.01)
*H01Q 1/24* (2006.01)
(Continued)

(52) U.S. Cl.
CPC ...... *H01Q 13/106* (2013.01); *H01L 21/76892* (2013.01); *H01L 23/12* (2013.01); *H01L 23/528* (2013.01); *H01L 23/66* (2013.01); *H01Q 1/248* (2013.01); *H01Q 1/52* (2013.01); *H01Q 13/085* (2013.01); *H01Q 23/00* (2013.01); *H01L 2224/16225* (2013.01); *H01L 2224/48091* (2013.01); *H01L 2224/48464* (2013.01)

(58) Field of Classification Search
CPC ............................ H01Q 21/064; H01Q 13/10
USPC ............................................ 343/770; 438/25
See application file for complete search history.

(56) References Cited

U.S. PATENT DOCUMENTS 5,264,860 A    11/1993 Quan
5,638,033 A *   6/1997 Walker .................... H01P 1/383
                                                              333/1.1
(Continued)

FOREIGN PATENT DOCUMENTS

GB          2173646 A    10/1986
JP       2005-017644 A     1/2005
(Continued)

OTHER PUBLICATIONS

Tawk et al.; A Varactor-Based Reconfigurable Filtenna; IEEE Antennas and Wireless Propagation Letters, vol. 11, p. 716-719 (Jan. 1, 2012).*

(Continued)

*Primary Examiner* — Dameon E Levi
*Assistant Examiner* — Ab Salam Alkassim, Jr.
(74) *Attorney, Agent, or Firm* — Panitch Schwarze Belisario & Nadel LLP

(57) ABSTRACT

First and second conductor layers are formed on a main surface of a base layer. A tapered slot is formed between the first and second conductive layers. A first slit is formed at the first conductor layer, and a second slit is formed at the second conductor layer. Thus, the first conductor layer is divided into a first device connection portion and a first antenna portion, and the second conductor layer is divided into a second device connection portion and a second antenna portion. A semiconductor device is connected to the first and second device connection portions.

7 Claims, 34 Drawing Sheets

(51) Int. Cl.
*H01Q 1/52* (2006.01)
*H01Q 13/08* (2006.01)
*H01L 21/768* (2006.01)
*H01L 23/12* (2006.01)
*H01L 23/528* (2006.01)
*H01L 23/66* (2006.01)
*H01Q 23/00* (2006.01)

(56) References Cited

U.S. PATENT DOCUMENTS

| | | | | |
|---|---|---|---|---|
| 5,748,153 | A * | 5/1998 | McKinzie, III | H01Q 13/085 343/767 |
| 5,949,382 | A * | 9/1999 | Quan | H01Q 13/085 343/767 |
| 6,008,770 | A * | 12/1999 | Sugawara | H01Q 13/085 343/767 |
| 6,317,094 | B1 * | 11/2001 | Wu | H01Q 13/085 343/767 |
| 6,351,246 | B1 * | 2/2002 | McCorkle | H01Q 1/38 343/786 |
| 6,963,312 | B2 * | 11/2005 | Schuneman | H01Q 13/085 343/767 |
| 7,271,776 | B2 * | 9/2007 | Le Bolzer | H01Q 21/20 343/767 |
| 7,557,755 | B2 * | 7/2009 | Han | H01Q 1/38 343/700 MS |
| 2003/0095073 | A1 * | 5/2003 | Thudor | H01Q 3/242 343/770 |
| 2004/0069984 | A1 * | 4/2004 | Estes | B82Y 10/00 257/25 |
| 2004/0217911 | A1 * | 11/2004 | Le Bolzer | H01Q 21/20 343/770 |
| 2005/0024281 | A1 * | 2/2005 | Apostolos | H01Q 9/26 343/767 |
| 2006/0085160 | A1 | 4/2006 | Ouchi | |
| 2006/0164313 | A1 | 7/2006 | Le Bolzer et al. | |
| 2007/0013596 | A1 | 1/2007 | Fukuchi | |
| 2007/0279143 | A1 | 12/2007 | Itsuji | |
| 2008/0304038 | A1 | 12/2008 | Ouchi | |
| 2008/0315098 | A1 | 12/2008 | Itsuji | |
| 2009/0134329 | A1 | 5/2009 | Kasai et al. | |
| 2010/0026401 | A1 | 2/2010 | Mukai et al. | |
| 2010/0072373 | A1 | 3/2010 | Nakajima | |
| 2010/0310976 | A1 | 12/2010 | Kajiki | |
| 2011/0001679 | A1 | 1/2011 | Meharry et al. | |
| 2011/0102284 | A1 * | 5/2011 | Brown | H01P 5/107 343/767 |
| 2012/0001698 | A1 | 1/2012 | Koyama et al. | |
| 2012/0308201 | A1 | 12/2012 | Toji | |
| 2013/0021218 | A1 * | 1/2013 | Asanuma | H01Q 1/243 343/810 |
| 2013/0038495 | A1 * | 2/2013 | Benzel | H01Q 21/08 343/770 |
| 2013/0181782 | A1 | 7/2013 | Koyama et al. | |
| 2014/0203994 | A1 * | 7/2014 | Hodono | H01Q 1/38 343/878 |
| 2015/0054709 | A1 * | 2/2015 | Tawk | H01Q 13/085 343/861 |
| 2015/0295322 | A1 | 10/2015 | Asanuma et al. | |

FOREIGN PATENT DOCUMENTS

| | | |
|---|---|---|
| JP | 2006-184078 A | 7/2006 |
| JP | 200749672 A | 2/2007 |
| JP | 2007-124250 A | 5/2007 |
| JP | 2007-139445 A | 6/2007 |
| JP | 2008-011490 A | 1/2008 |
| JP | 4154388 B2 | 9/2008 |
| JP | 2008-244620 A | 10/2008 |
| JP | 2008-283552 A | 11/2008 |
| JP | 2009-141661 A | 6/2009 |
| JP | 2009-200461 A | 9/2009 |
| JP | 2010-057161 A | 3/2010 |
| JP | 2010-252299 A | 11/2010 |
| JP | 2010-283176 A | 12/2010 |
| JP | 2012-248259 A | 12/2012 |
| JP | 2013-005115 A | 1/2013 |
| WO | 0247205 A1 | 6/2002 |
| WO | 2012104941 A1 | 8/2012 |

OTHER PUBLICATIONS

Hamid et al.; Switched-Based Vivaldi Antenna; IEEE Transactions on Antennas and Propagation, vol. 59, No. 5, p. 1472-1480 (May 1, 2011).*

Extended European Search Report issued Jun. 25, 2014 in EP Application No. 14154629.1.

Tawk et al, "A Varactor-Based Reconfigurable Filtenna," IEEE Antennas and Wireless Propagation Letters, vol. 11, pp. 716-719 (Jan. 1, 2012).

Hamid et al, "Switched-Band Vivaldi Antenna," IEEE Transactions on Antennas and Propagation, vol. 59, No. 5, pp. 1472-1480 (May 1, 2011).

Decision to Grant issued Oct. 19, 2016 in JP Application No. 2013-053535.

* cited by examiner

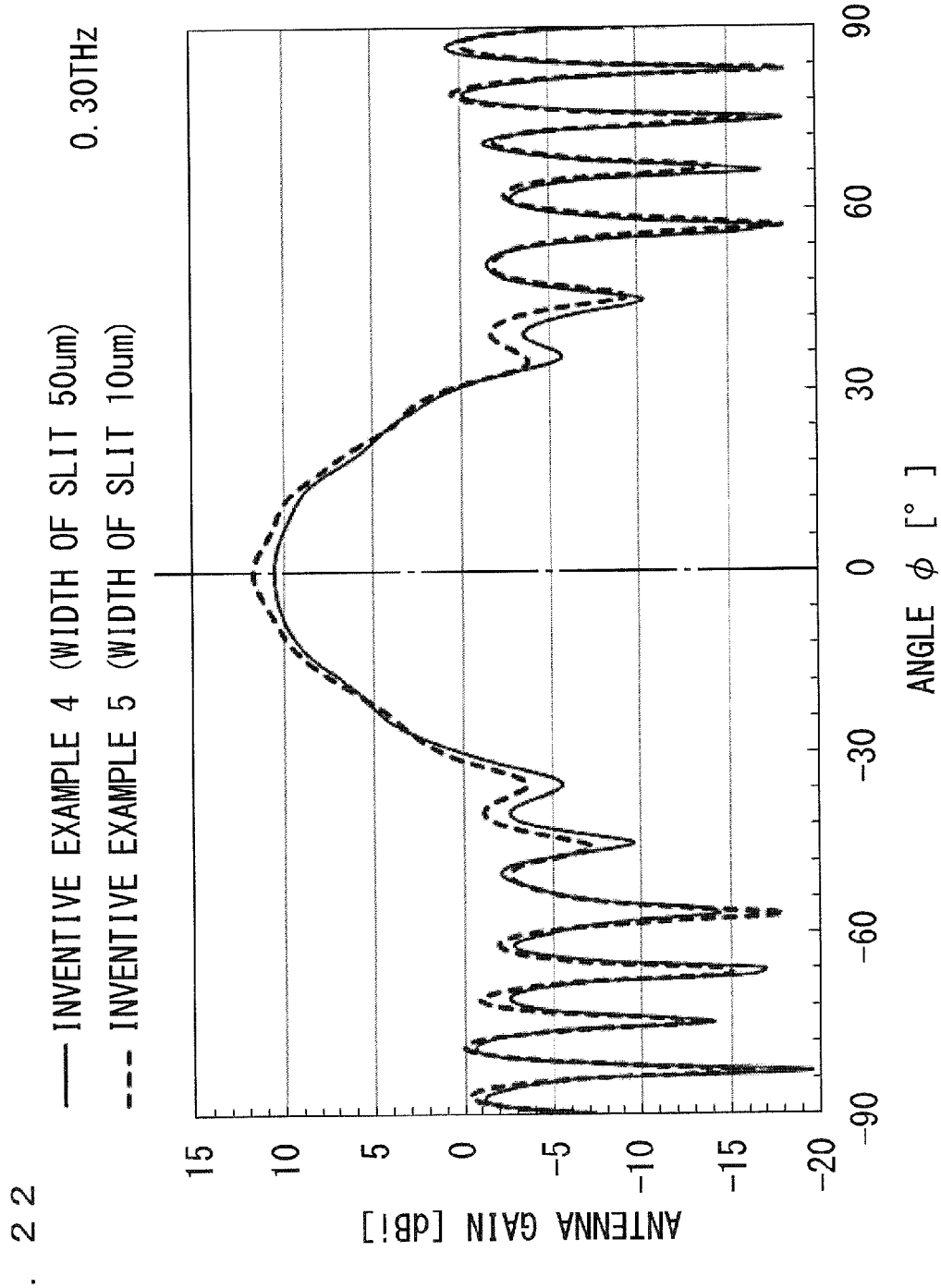
F I G. 22

ANTENNA MODULE AND METHOD FOR MANUFACTURING THE SAME

BACKGROUND OF THE INVENTION

Field of the Invention

The present invention relates to an antenna module that transmits or receives an electromagnetic wave of a frequency in a terahertz band not less than 0.05 THz and not more than 10 THz, for example, and a method for manufacturing the antenna module.

Description of Related Art

Terahertz transmission using an electromagnetic wave in the terahertz band is expected to be applied to various purposes such as short-range super high speed communication and uncompressed delayless super high-definition video transmission.

A terahertz oscillation detection device using a semiconductor substrate is described in JP 2013-5115 A. In the terahertz oscillation detection device described in JP 2013-5115 A, first and second electrodes, an MIM (Metal Insulator Metal) reflector, a resonator and an active element are formed on the semiconductor substrate. A horn opening is arranged between the first electrode and the second electrode. A resonant tunneling diode, for example, is used as an active element, and it is possible to use the terahertz oscillation detection device as an oscillation device or as a detection device by changing the applied voltage to the active element.

BRIEF SUMMARY OF THE INVENTION

In a case in which the above-mentioned terahertz oscillation detection device operates as the detection device, the transmission characteristics may be largely deteriorated at the time of receiving the electromagnetic wave in a specific frequency band. Therefore, the terahertz oscillation detection device cannot be used well as the detection device depending on the frequency band of the used electromagnetic wave.

An object of the present invention is to provide an antenna module in which deterioration of the transmission characteristics in a desired frequency band is suppressed, and a method for manufacturing the antenna module.

(1) According to one aspect of the present invention, an antenna module includes an insulative base layer that has first and second surfaces, an electrode formed on at least one surface of the first and second surfaces of the base layer to be capable of receiving or transmitting an electromagnetic wave in a terahertz band, and a semiconductor device that is mounted on at least one surface of the first and second surfaces of the base layer to be electrically connected to the electrode, and is operable in the terahertz band, wherein the electrode includes first and second conductor layers that constitute a tapered slot antenna having an opening, the opening has a width that continuously or gradually decreases from one end to another end of a set of the first and second conductor layers, a first slit is formed at the first conductor layer such that the first conductor layer is divided into a first device connection portion that is positioned at the other end of the first conductor layer and is electrically connected to the semiconductor device, and a first antenna portion that is not electrically connected to the semiconductor device, and a second slit is formed at the second conductor layer such that the second conductor layer is divided into a second device connection portion that is positioned at the other end of the second conductor layer and is electrically connected to the semiconductor device, and a second antenna portion that is not electrically connected to the semiconductor device.

The terahertz band indicates a frequency that is not less than 0.05 THz and not more than 10 THz, for example, and preferably indicates a frequency that is not less than 0.1 THz and not more than 1 THz.

In the antenna module, the electromagnetic wave in the terahertz band is transmitted or received by the electrode formed on at least one surface of the first and second surfaces of the base layer. Further, the semiconductor device mounted on at least one surface of the first and second surfaces of the base layer performs detection and rectification, or oscillation.

The tapered slot antenna having an opening is constituted by the first and second conductor layers of the electrode. The first slit is formed at the first conductor layer, whereby the first conductor layer is divided into the first device connection portion positioned at the other end of the first conductor layer and is electrically connected to the semiconductor device, and the first antenna portion that is not electrically connected to the semiconductor device. Similarly, the second slit is formed at the second conductor layer, whereby the second conductor layer is divided into the second device connection portion positioned at the other end of the second conductor layer and is electrically connected to the semiconductor device, and the second antenna portion that is not electrically connected to the semiconductor device.

At the time of receiving the electromagnetic wave, the semiconductor device performs detection and rectification, and outputs a signal that corresponds to the received electromagnetic wave. Part of the signal output from the semiconductor device propagates the first and second conductor layers. In this case, interference with the signal occurs in the first and second conductor layers, and the transmission characteristics of the signal are deteriorated in a specific frequency band. The frequency band in which the transmission characteristics are deteriorated depends on the size of portions of the first and second conductor layers in which the interference occurs. The larger the portions of the first and second conductor layers are, the lower the frequency band in which the transmission characteristics are deteriorated is.

The above-mentioned configuration blocks the signal that is output from the semiconductor device to propagate from the first and second device connection portions to the first and second antenna portions with the first and the second slits. Thus, the interference with the signal occurs only at the first and second device connection portions. Therefore, the frequency band in which the transmission characteristics are deteriorated can be shifted to a higher region as compared to a case in which the first and second slits are not formed. Further, the position, the width and the shape of the first and second slits are adjusted, whereby the frequency band in which the transmission characteristics are deteriorated can be adjusted. As a result, deterioration of the transmission characteristics at a desired frequency band can be suppressed.

(2) The first and second slits may be formed to be symmetrical with respect to a central axis of the opening. In this case, the directivity of the antenna module is improved.

(3) The first device connection portion may have an area smaller than the first antenna portion, and the second device connection portion may have an area smaller than the second antenna portion.

In this case, the frequency band in which the transmission characteristics are deteriorated can be shifted to a sufficiently higher region as compared to a case in which the first and second slits are not formed. Thus, deterioration of the transmission characteristics in an even higher frequency band can be suppressed.

(4) The first conductor layer may have a first side surface, the second conductor layer may have a second side surface, the opening may be formed between the first side surface of the first conductor layer and the second side surface of the second conductor layer, the first slit may be formed to extend outward from the first side surface of the first conductor layer to the other end, and the second slit may be formed to extend outward from the second side surface of the second conductor layer to the other end.

In this case, deterioration of the transmission characteristics in a desired frequency band can be suppressed while a decrease in antenna gain is suppressed. Further, the areas of the first and second device connection portions can be sufficiently reduced to be smaller than the areas of the first and second antenna portions while the regions of the first and second device connection portions for connecting the semiconductor device is ensured.

(5) The first and second slits may be linearly formed.

In this case, deterioration of the transmission characteristics in a desired frequency band can be suppressed while a decrease in antenna gain is suppressed. Further, the areas of the first and second device connection portions can be sufficiently reduced to be smaller than the areas of the first and second antenna portions while the regions of the first and second device connection portions for connecting the semiconductor device is ensured.

(6) The first slit may be formed in a curved line such that an angle of the first slit with a central axis of the opening is gradually reduced from the first side surface of the first conductor layer, and the second slit may be formed in a curved line such that an angle of the second slit with a central axis of the opening is gradually reduced from the second side surface of the second conductor layer.

In this case, deterioration of the transmission characteristics in the desired frequency band can be suppressed while a decrease in antenna gain is suppressed. Further, the areas of the first and second device connection portions can be sufficiently reduced to be smaller than the areas of the first and second antenna portions while the regions of the first and second device connection portions for connecting the semiconductor device are ensured.

(7) The first conductor layer may have a first end surface substantially vertical to a central axis of the opening on the other end side, the second conductor layer may have a second end surface substantially vertical to a central axis of the opening on the other end side, the first slit may be formed to extend from the first side surface to the first end surface of the first conductor layer, and the second slit may be formed to extend from the second side surface to the second end surface of the second conductor layer.

In this case, deterioration of the transmission characteristics in a desired frequency band can be suppressed while a decrease in antenna gain is suppressed. Further, the areas of the first and second device connection portions can be reduced to be sufficiently smaller than the areas of the first and second antenna portions while the regions of the first and second device connection portions for connecting the semiconductor device is ensured.

(8) The base layer may be a dielectric film made of resin.

In this case, the effective relative permittivity of the surroundings of the electrode is reduced. Thus, the electromagnetic wave radiated from the electrode or the electromagnetic wave received by the electrode are less likely attracted to the dielectric film. Therefore, the antenna module can efficiently radiate the electromagnetic wave, and the directivity of the antenna module is improved. Further, the transmission loss of the electromagnetic wave is reduced, and the transmission speed and the transmission distance can be improved.

(9) According to another aspect of the present invention, a method for manufacturing an antenna module includes the steps of forming an electrode on at least one surface of the first and second surfaces of the insulative base layer to be capable of receiving or transmitting an electromagnetic wave in a terahertz band, and mounting a semiconductor device operable in the terahertz band on at least one surface of the first and second surfaces of the base layer to be electrically connected to the electrode, wherein the electrode includes first and second conductor layers that constitute a tapered slot antenna having an opening, the opening has a width that continuously or gradually decreases from one end to another end of a set of the first and second conductor layers, a first slit is formed at the first conductor layer such that the first conductor layer is divided into a first device connection portion that is positioned at the other end of the first conductor layer and is electrically connected to the semiconductor device, and a first antenna portion that is not electrically connected to the semiconductor device, and a second slit is formed at the second conductor layer such that the second conductor layer is divided into a second device connection portion that is positioned at the other end of the second conductor layer and is electrically connected to the semiconductor device, and the second antenna portion that is not electrically connected to the semiconductor device.

In the antenna module manufactured by the manufacturing method, the electromagnetic wave in the terahertz band is transmitted or received by the electrode formed on at least one surface of the first and second surfaces of the base layer. Further, the semiconductor device mounted on at least one surface of the first and second surfaces of the base layer performs detection and rectification, or oscillation.

The tapered slot antenna having an opening is constituted by the first and second conductor layers of the electrode. The first slit is formed at the first conductor layer, whereby the first conductor layer is divided into the first device connection portion positioned at the other end of the first conductor layer and is electrically connected to the semiconductor device, and the first antenna portion that is not electrically connected to the semiconductor device. Similarly, the second slit is formed at the second conductor layer, whereby the second conductor layer is divided into the second device connection portion that is positioned at the other end of the second conductor layer and electrically connected to the semiconductor device, and the second antenna portion that is not electrically connected to the semiconductor device.

Such configuration blocks the signal that is output from the semiconductor device to propagate from the first and second device connection portions to the first and second antenna portions with the first and second slits. Thus, the interference with the signal occurs only at the first and second device connection portions. Therefore, the frequency band in which the transmission characteristics are deteriorated can be shifted to a higher region as compared to a case in which the first and second slits are not formed. Further, the position, the width and the shape of the first and second slits are adjusted, whereby the frequency band in which the transmission characteristics are deteriorated can be adjusted. As a result, deterioration of the transmission characteristics in a desired frequency band can be suppressed.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 22 is a diagram showing the simulation results of the antenna gain in the inventive examples 4 and 5;

DESCRIPTION OF THE PREFERRED EMBODIMENTS

An antenna module and a method for manufacturing the antenna module according to embodiments of the present invention will be described below. In the following description, a frequency band from 0.05 THz to 10 THz is referred to as the terahertz band. The antenna module according to the embodiments can transmit or receive an electromagnetic wave having at least a specific frequency in the terahertz band.

(1) First Embodiment (1-1) Configuration of Antenna Module

Figure 1:
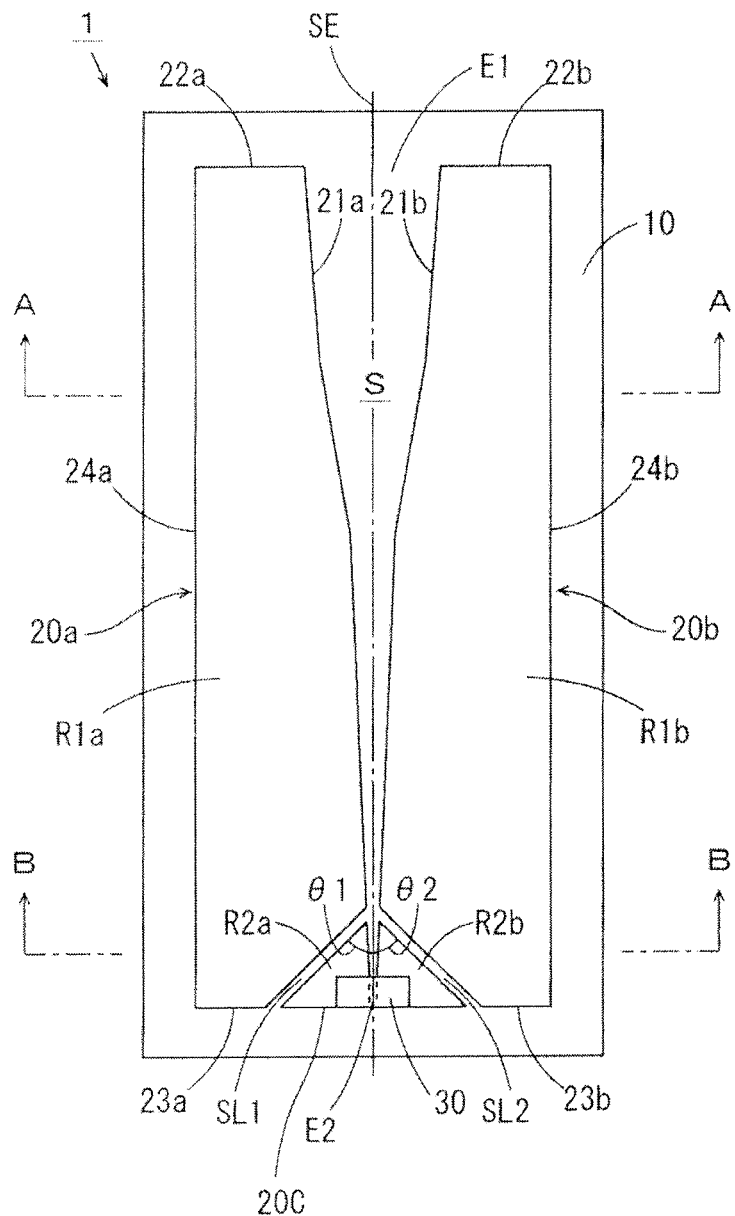
FIG. 1 is a schematic plan view of an antenna module according to a first embodiment of the present invention.
Figure 2:
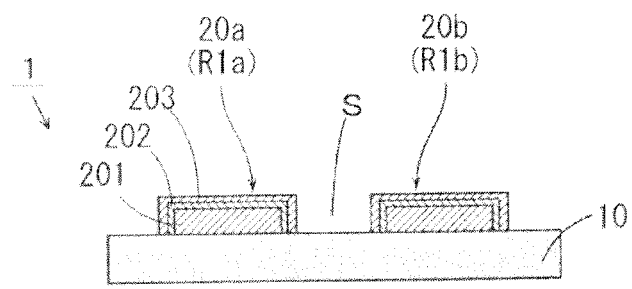
FIG. 2 is a schematic cross sectional view taken along the line A-A of the antenna module of FIG. 1.
Figure 3:
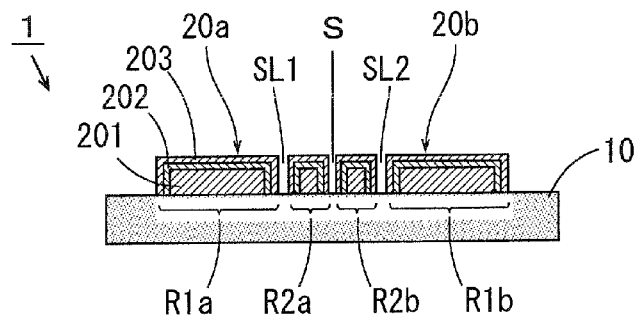
FIG. 3 is a schematic cross sectional view taken along the line B-B of the antenna module of FIG. 1.

FIG. 1 is a schematic plan view of the antenna module according to the first embodiment of the present invention. FIG. 2 is a schematic cross sectional view taken along the line A-A of the antenna module of FIG. 1. FIG. 3 is a schematic cross sectional view taken along the line B-B of the antenna module of FIG. 1.

In FIG. 1, the antenna module 1 is constituted by a base layer 10, a pair of electrodes 20a, 20b and a semiconductor device 30. The base layer 10 is made of an insulative material. One surface of the two surfaces of the base layer 10 opposite to each other is referred to as a main surface, and the other surface is referred to as a back surface. In the present embodiment, the main surface is an example of a first surface, and the back surface is an example of a second surface.

The pair of electrodes 20a, 20b, is formed on the main surface of the base layer 10. A gap that extends from one end to the other end of a set of the electrodes 20a, 20b, is provided between the electrodes 20a, 20b. Side surfaces 21a, 21b, of the electrodes 20a, 20b, that face each other are formed in a tapered shape such that the width of the gap continuously or gradually decreases from the one end to the other end of a set of the electrodes 20a, 20b. The gap between the electrodes 20a, 20b is referred to as a tapered slot S. The electrodes 20a, 20b constitute a tapered slot antenna.

Here, the dimension in the direction of a central axis SE of the tapered slot S is referred to as length, and a direction parallel to the main surface of the base layer 10 and orthogonal to the central axis SE of the tapered slot S is referred to as a width direction and the dimension of the tapered slot S in the direction is referred to as width. The end of the tapered slot S having the maximum width is referred to as an opening end E1, and the end of the tapered slot S having the minimum width is referred to as a mount end E2. Further, a direction directed from the mount end E2 toward the opening end E1 on the central axis SE is referred to as a central axis direction. The electrodes 20a, 20b are formed to be symmetrical with each other with respect to the central axis SE of the tapered slot S. The electrode 20a has end surfaces 22a, 23a that extend in the width direction, and the side surface 24a that extends in parallel to the central axis SE outside of the tapered slot S. The electrode 20b has the end surfaces 22b, 23b that extend in the width direction, and has a side surface 24b that extends in parallel to the central axis SE outside of the tapered slot S. The opening end E1 is positioned between the end surface 22a of the electrode 20a and the end surface 22b of the electrode 20b, and the mount end E2 is positioned between the end surface 23a of the electrode 20a and the end surface 23b of the electrode 20b.

A line slit SL1 is formed at the electrode 20a, and a line slit SL2 is formed at the electrode 20b. The slits SL1, SL2 are formed to be symmetrical with each other with respect to the central axis SE of the tapered slot S. In the present embodiment, the slit SL1 linearly extends from the side surface 21a to the end surface 23a, and the slit SL2 linearly extends from the side surface 21b to the end surface 23b. Thus, the electrode 20a is divided into a region R1a and a region R2a, and the electrode 20b is divided into a region R1b and a region R2b. The opening end E1 is formed between the end surfaces 22a, 22b of the regions R1a, R1b, and the mount end E2 is formed between the end surfaces 23a, 23b of the regions R2a, R2b.

The one end of the slit SL1 is preferably positioned at the center of the end surface 23a in the width direction, and the one end of the slit SL2 is preferably positioned at the center of the end surface 23b in the width direction. The width of the slit SL1 is not less than 1 µm and not more than 100 µm, for example, and is preferably not less than 10 µm and not more than 50 µm. An angle θ1 of the slit SL1 with the central axis SE and an angle θ2 of the slit SL2 with the central axis SE is preferably respectively not less than 15° and not more than 75°, and more preferably not less than 30° and not more than 60°.

The base layer 10 and the electrodes 20a, 20b are formed of a flexible printed circuit board, for example. In this case, the electrodes 20a, 20b are formed on the base layer 10 using a subtractive method, an additive method or a semi-additive method. If a below-mentioned semiconductor device 30 is appropriately mounted, the electrodes 20a, 20b may be formed on the base layer 10 using another method. For example, the electrodes 20a, 20b may be formed by patterning a conductive material on the base layer 10 using a screen printing method, an ink-jet method or the like.

The semiconductor device 30 is mounted on the regions R2a, R2b of the electrodes 20a, 20b at the mount end E2 using a flip chip mounting method or a wire bonding mounting method. One terminal of the semiconductor device 30 is electrically connected to the region R2a of the electrode 20a, and another terminal of the semiconductor device 30 is electrically connected to the region R2b of the electrode 20b. The mounting method of the semiconductor device 30 will be described below.

The base layer 10 is made of an insulative material. For example, resin made of polymer is used as the material for the base layer 10. The resin made of polymer includes one or more types of porous resins or non-porous resins out of polyimide, polyetherimide, polyamide-imide, polyolefin, cycloolefin polymer, polyarylate, polymethyl methacrylate polymer, liquid crystal polymer, polycarbonate, polyphenylene sulfide, polyether ether ketone, polyether sulfone, polyacetal, fluororesin, polyester, epoxy resin, polyurethane resin and urethane acrylic resin (acryl resin).

Fluororesin includes polytetrafluoroethylene, polyvinylidene fluoride, ethylene-tetrafluoroethylene copolymer, perfluoro-alkoxy fluororesin, fluorinated ethylene-propylene copolymer (tetrafluoroethylene-hexafluoropropylene copolymer) or the like. Polyester includes polyethylene terephthalate, polyethylene naphthalate, polybutylene terephthalate or the like.

Further, ceramic, glass, silicon, a compound semiconductor or the like may be used as the material for the base layer 10, or the composition of those may be used. Alternatively, another material that is insulative and can be formed into a plate shape or a film shape may be used as the material for the base layer 10.

In the present embodiment, the base layer 10 is formed of resin made of polymer (polyimide, for example). The thickness of the base layer 10 is preferably not less than 1 µm and not more than 1000 µm. In this case, the base layer 10 can be easily fabricated and flexibility of the base layer 10 can be easily ensured. The thickness of the base layer 10 is more preferably not less than 5 µm and not more than 100 µm. In this case, the base layer 10 can be more easily fabricated and higher flexibility of the base layer 10 can be easily ensured. In the present embodiment, the thickness of the base layer 10 is 25 µm, for example.

The base layer 10 preferably has a relative permittivity of not more than 7.0 and more preferably has a relative permittivity of not more than 4.0 in a used frequency within the terahertz band. In this case, the radiation efficiency of an electromagnetic wave having the used frequency is sufficiently increased and the transmission loss of the electromagnetic wave is sufficiently reduced. Thus, the transmission speed and the transmission distance of the electromagnetic wave having the used frequency can be sufficiently improved. In the present embodiment, the base layer 10 is formed of resin having a relative permittivity of not less than 1.2 and not more than 7.0 in the terahertz band. The relative permittivity of polyimide is about 3.2 in the terahertz band, and the relative permittivity of porous polytetrafluoroethylene (PTFE) is about 1.2 in the terahertz band.

The electrodes 20a, 20b may be formed of a conductive material such as metal or an alloy, and may have single layer structure or laminate structure of a plurality of layers.

In the present embodiment, as shown in FIGS. 2 and 3, each of the electrodes 20a, 20b has the laminate structure of a copper layer 201, a nickel layer 202 and a gold layer 203. The thickness of the copper layer 201 is 15 μm, for example, the thickness of the nickel layer 202 is 3 μm, for example and the thickness of the gold layer 203 is 0.2 μm, for example. The material and the thickness of the electrodes 20a, 20b are not limited to the examples of the present embodiment.

In the present embodiment, the laminate structure of FIGS. 2 and 3 is adopted to perform the flip chip mounting by Au stud bumps and a wire bonding mounting by Au bonding wires, mentioned below. Formation of the nickel layer 202 and the gold layer 203 is surface processing for the copper layer 201 in a case in which the afore-mentioned mounting methods are used. When another mounting method using solder balls, ACFs (anisotropic conductive films), ACPs (anisotropic conductive pastes) or the like are used, processing appropriate for respective mounting method is selected.

One or plurality of semiconductor devices selected from a group consisting of a resonant tunneling diode (RTD), a Schottky-barrier diode (SBD), a TUNNETT (Tunnel Transit Time) diode, an IMPATT (Impact Ionization Avalanche Transit Time) diode, a high electron mobility transistor (HEMT), a GaAs field effect transistor (FET), a GaN field effect transistor (FET) and a Heterojunction Bipolar Transistor (HBT) is used as the semiconductor device 30. These semiconductor devices are active elements. A quantum element, for example, can be used as the semiconductor device 30. In the present embodiment, the semiconductor device 30 is a Schottky-barrier diode.

Figure 4:
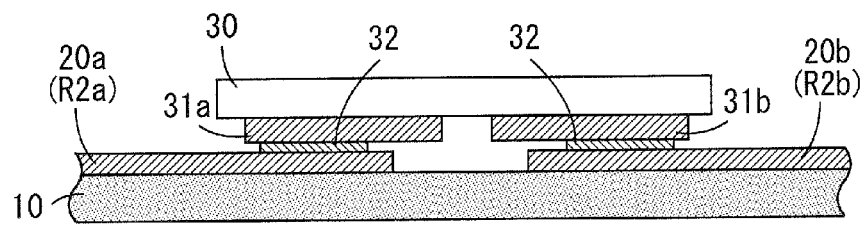
FIG. 4 is a schematic diagram showing the mounting of a semiconductor device using a flip chip mounting method.

FIG. 4 is a schematic diagram showing the mounting of the semiconductor device 30 using the flip chip mounting method. As shown in FIG. 4, the semiconductor device 30 has terminals 31a, 31b. The terminals 31a, 31b are an anode and a cathode of a diode, for example. The semiconductor device 30 is positioned above the regions R2a, R2b of the electrodes 20a, 20b such that the terminals 31a, 31b are directed downward, and the terminals 31a, 31b are bonded to the regions R2a, R2b of the electrodes 20a, 20b using Au stud bumps 32, respectively.

Figure 5:
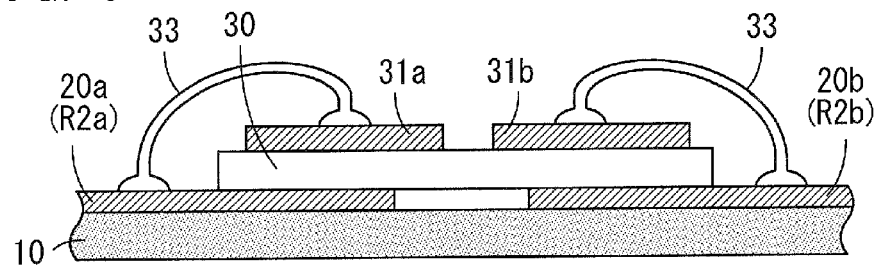
FIG. 5 is a schematic diagram showing the mounting of the semiconductor device using a wire bonding mounting method.

FIG. 5 is a schematic diagram showing the mounting of the semiconductor device 30 using the wire bonding mounting method. As shown in FIG. 5, the semiconductor device 30 is positioned on the regions R2a, R2b of the electrodes 20a, 20b such that the terminals 31a, 31b are directed upward, and the terminals 31a, 31b are connected to the regions R2a, R2b of the electrodes 20a, 20b respectively using Au bonding wires 33.

In the antenna module 1 of FIG. 1, an area from the opening end E1 of the taper slot S to the mount portion for the semiconductor device 30 functions as a transmitter/receiver that transmits or receives the electromagnetic wave. The frequency of the electromagnetic wave transmitted or received by the antenna module 1 is determined by the width of the taper slot S and an effective permittivity of the tapered slot S. The effective permittivity of the tapered slot S is calculated based on the relative permittivity of the air between the electrodes 20a, 20b, and the relative permittivity and the thickness of the base layer 10.

Generally, a wavelength λ of the electromagnetic wave in a medium is expressed in the following formula.

$$\lambda = \lambda_0 / \sqrt{\in_{ref}}$$

$\lambda_0$ is a wavelength of the electromagnetic wave in a vacuum, and $\in_{ref}$ is an effective relative permittivity of the medium. Therefore, if the effective relative permittivity of the tapered slot S increases, a wavelength of the electromagnetic wave in the tapered slot S is shortened. In contrast, if the effective relative permittivity of the tapered slot S decreases, a wavelength of the electromagnetic wave in the tapered slot S is lengthened. When the effective relative permittivity of the tapered slot S is assumed to be minimum 1, the electromagnetic wave of 0.1 THz is transmitted or received at a portion where the width of the tapered slot S is 1.5 mm. The tapered slot S preferably includes a portion having the width of 2 mm in consideration of a margin.

The length of the tapered slot S is preferably not less than 0.5 mm and not more than 30 mm. A mount area for the semiconductor device 30 can be ensured when the length of the tapered slot S is not less than 0.5 mm. Further, the length of the tapered slot S is preferably not more than 30 mm on the basis of ten wavelengths.

(1-2) Connection with Another Substrate

Figure 6:
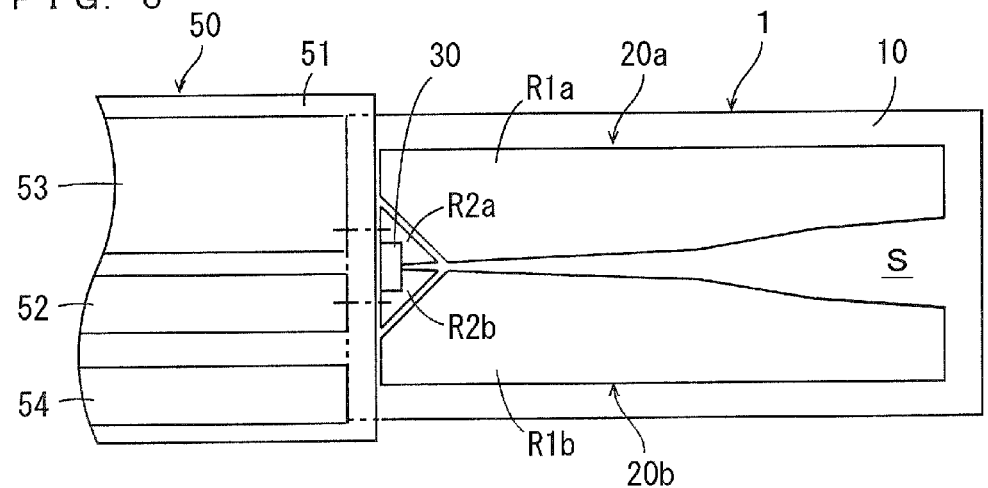
FIG. 6 is a diagram for explaining a connection example of the antenna module with another substrate.

FIG. 6 is a diagram for explaining a connection example of the antenna module 1 with another substrate. In the example of FIG. 6, the antenna module 1 is connected to a circuit board 50. The circuit board 50 has an insulating layer 51, a signal transmission line 52 and ground lines 53, 54. The signal transmission line 52 and the ground lines 53, 54 are formed on the insulating layer 51 to be parallel to each other. The signal transmission line 52 is arranged between the ground lines 53, 54.

The insulating layer 51 is formed of various types of insulative materials such as polyimide or epoxy. The signal transmission line 52 and the ground lines 53, 54 may be formed of a conductive material such as metal or an alloy, and may have single layer structure or laminate structure of a plurality of layers.

The region R2a of the electrode 20a is electrically connected to the ground line 53. The region R2b of the electrode 20b is electrically connected to the signal transmission line 52. The ground line 53 and the ground line 54 are electrically connected to each other (not shown).

Figure 7:
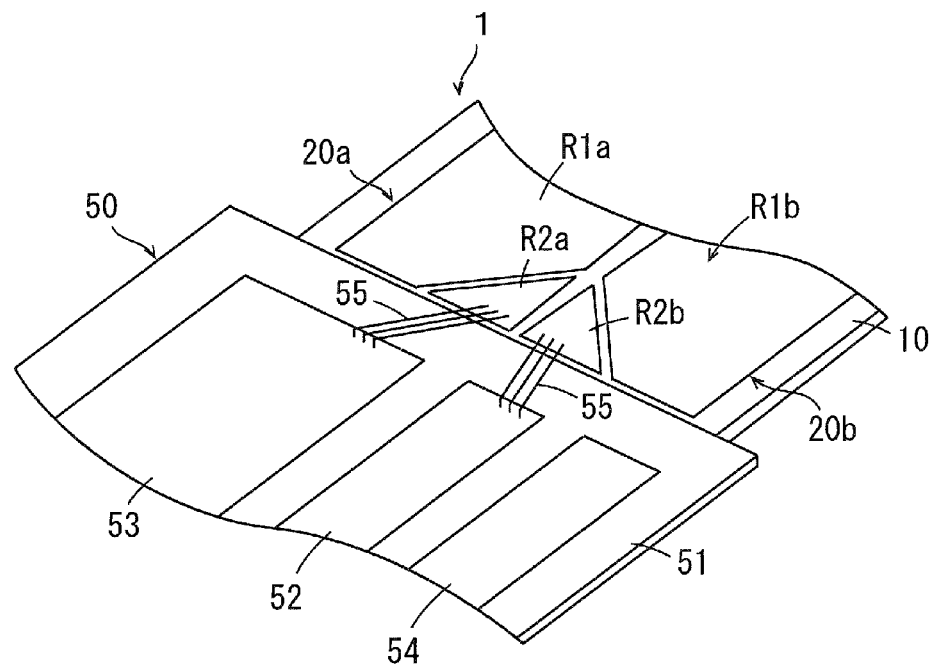
FIG. 7 is a diagram for explaining a specific connection example between an electrode and a ground line, and between the electrode and a signal transmission line.
Figure 8:
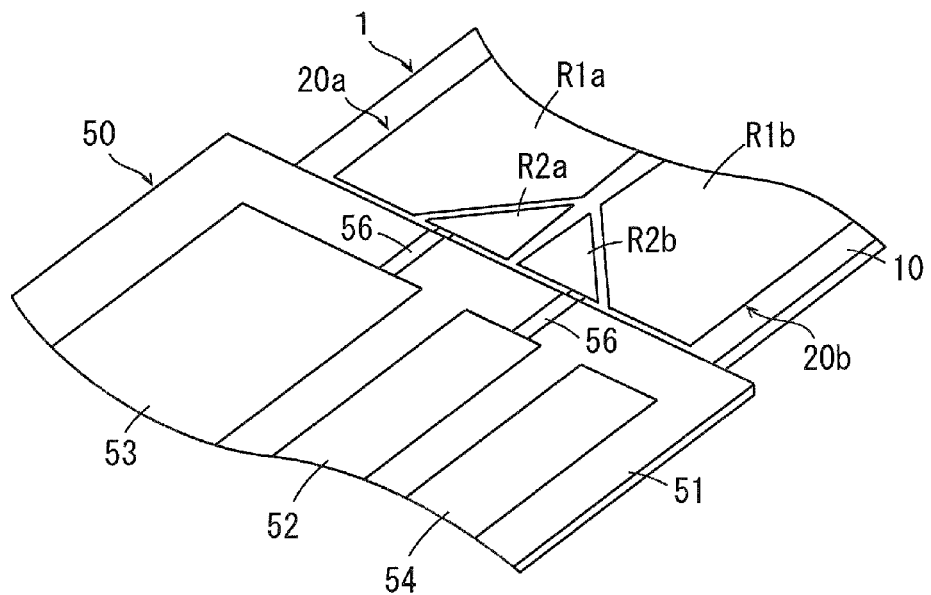
FIG. 8 is a diagram for explaining a specific connection example between the electrode and the ground line, and between the electrode and the signal transmission line.

FIGS. 7 and 8 are diagrams for explaining a specific connection example between the electrode 20a and the ground line 53, and between the electrode 20b and the signal transmission line 52.

In the example of FIG. 7, the region R2a of the electrode 20a and the ground line 53 are electrically connected via a plurality of wires 55. Similarly, the region R2b of the electrode 20b and the signal transmission line 52 are electrically connected via the plurality of wires 55. The wire 55 is formed of a conductive material such as metal or an alloy.

In the example of FIG. 8, the region R2a of the electrode 20a and the ground line 53 are electrically connected via a conductive pattern 56. Similarly, the region R2b of the electrode 20b and the signal transmission line 52 are electrically connected via the conductive pattern 56. The conductive pattern 56 is made of a conductive material such as metal or an alloy, and respectively formed on the base layer 10 and the insulating layer 51 to extend between the region R2a of the electrode 20a and the ground line 53, and between the region R2b of the electrode 20b and the signal transmission line 52.

(1-3) Operation of Antenna Module

Figure 9:
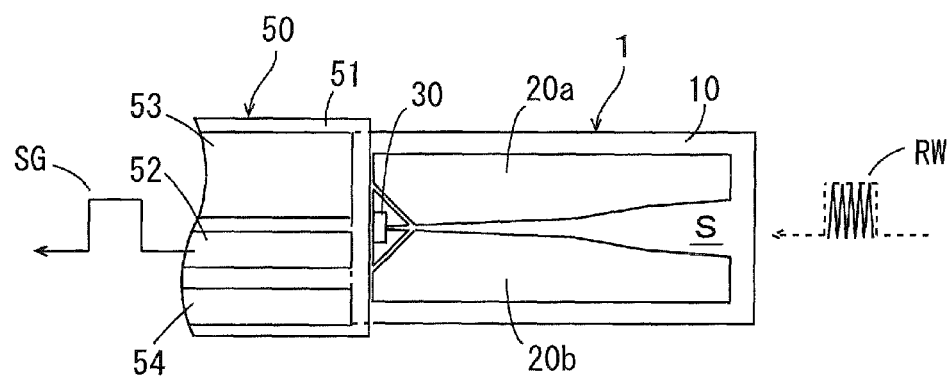
FIG. 9 is a schematic plan view showing the reception operation of the antenna module according to the present embodiment.

FIG. 9 is a schematic plan view showing the reception operation of the antenna module 1 according to the present embodiment. In FIG. 9, the electromagnetic wave RW includes a digital intensity modulated signal wave having a frequency (0.3 THz, for example) in the terahertz band and a signal (a base band signal) having a frequency (1 GHz, for example) in a gigahertz band.

The electromagnetic wave RW is received in the tapered slot S of the antenna module 1. Thus, an electric current having a frequency component in the terahertz band flows in the electrodes 20a, 20b.

The semiconductor device 30 performs detection and rectification. Thus, a signal SG having a frequency (1 GHz, for example) in the gigahertz band is output from the semiconductor device 30. The output signal SG is transmitted to an external circuit (not shown) or the like through the signal transmission line 52 and the ground line 53 of the circuit board 50.

Figure 10:
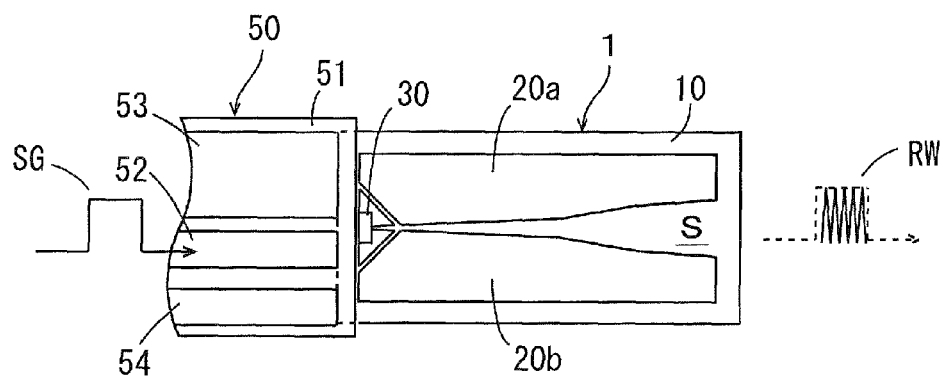
FIG. 10 is a schematic plan view showing the transmission operation of the antenna module according to the present embodiment.

FIG. 10 is a schematic plan view showing the transmission operation of the antenna module 1 according to the present embodiment. In FIG. 10, the signal SG having a frequency (1 GHz, for example) in the gigahertz band is input to the semiconductor device 30 through the signal transmission line 52 and the ground line 53 of the circuit board 50. The semiconductor device 30 performs oscillation. Thus, the electromagnetic wave RW is transmitted from the tapered slot S of the antenna module 1. The electromagnetic wave RW includes a digital intensity modulated signal wave having a frequency (0.3 THz, for example) in the terahertz band and a signal (a base band signal) having a frequency (1 GHz, for example) in a gigahertz band.

In the present embodiment, the region R1a and the region R2a of the electrode 20a are spacially separated, and the region R1b and the region R2b of the electrode 20b are spacially separated. However, the electromagnetic wave RW has an advancing property. Specifically, the electromagnetic wave RW advances from the opening end E1 to the mount end E2 of the tapered slot S at the time of receipt, and the electromagnetic wave RW advances from the mount end E2 to the opening end E1 of the tapered slot S at the time of transmission. In particular, the electromagnetic wave RW in the terahertz band has a high advancing property. Thus, the electromagnetic wave RW is transmitted between the region R1a and the region R2a of the electrode 20a, and between the region R1b and the region R2b of the electrode 20b. As a result, even if each of the electrodes 20a, 20b is spacially separated, the antenna module 1 can appropriately perform the receipt operation and the transmission operation of the electromagnetic wave RW.

Further, in the present embodiment, the material having a low relative permittivity (polyimide, for example) is used as the base layer 10. Thus, at the time of transmission of the electromagnetic wave RW, the electromagnetic wave RW advances in the central axis direction of the antenna module 1 without being attracted to the base layer 10.

(1-4) Characterization of Antenna Module

Characteristics of the antenna module 1 according to the present embodiment was evaluated by the simulation.

(a) Inventive Examples 1, 2 and Comparative Example

Figure 11:
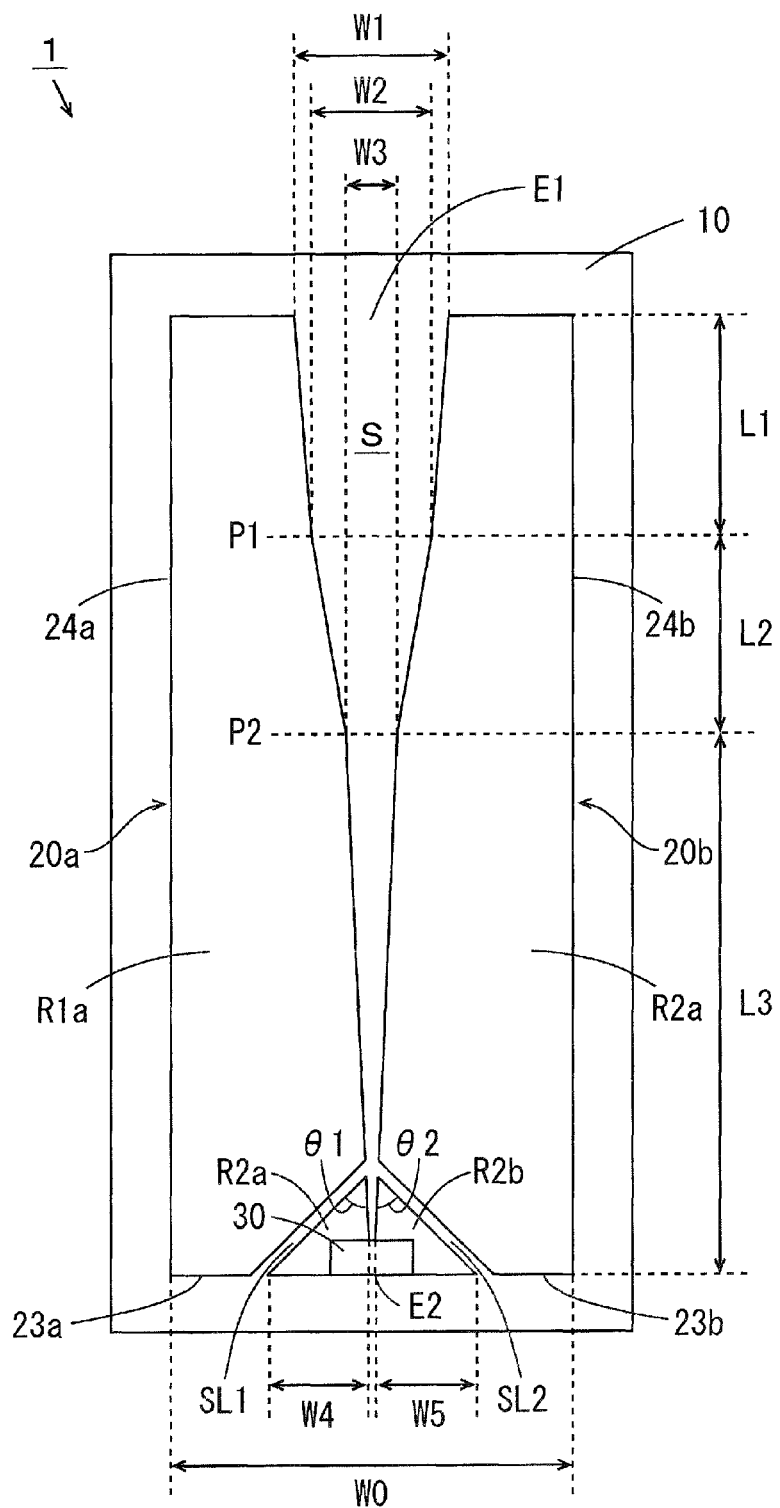
FIG. 11 is a schematic plan view for explaining the dimensions of the antenna module of the inventive examples 1 and 2.

FIG. 11 is a schematic plan view for explaining the dimensions of the antenna module 1 of the inventive examples 1 and 2.

The distance W0 between the side surfaces 24a, 24b of the electrodes 20a, 20b in the width direction is 2.83 mm. The width W1 of the tapered slot S at the opening end E1 is 1.11 mm. The widths W2, W3 of the tapered slot S at positions P1, P2 between the opening end E1 and the mount end E2 are respectively 0.88 mm and 0.36 mm. The length L1 between the opening end E1 and the position P1 is 1.49 mm, the length L2 between the position P1 and the position P2 is 1.49 mm. The length L3 between the position P2 and the mount end E2 is 3.73 mm. The width of the tapered slot S at the mount end E2 is 50 μm.

The widths of the slits SL1, SL2 are respectively 50 μm. The one end of the slit SL1 is positioned substantially at the center of the end surface 23a of the electrode 20a in the width direction, and the one end of the slit SL2 is positioned substantially at the center of the end surface 23b of the electrode 20b in the width direction. The width W4 of a portion of the end surface 23a that constitutes the region R2a, and the width W5 of a portion of the end surface 23b that constitutes the region R2b are 0.7525 mm, respectively. The angle θ1 of the slit SL1 with the central axis SE and the angle θ2 of the slit SL2 with the central axis SE are 45°, respectively.

Further, in the inventive examples 1 and 2 the base layer 10 is made of polyimide, and the electrodes 20a, 20b have a laminate structure of the copper layer 201, the nickel layer 202 and the gold layer 203 of FIGS. 2 and 3. The thickness of the base layer 10 is 25 μm, the thickness of the copper layer 201 is 15 μm, the thickness of the nickel layer 202 is 3 μm and the thickness of the gold layer 203 is 0.2 μm.

The antenna module 1 of the inventive example 1 is electrically connected to the circuit board 50 via the plurality of wires 55 as shown in FIG. 7. Each wire 55 is made of gold. The antenna module 1 of the inventive example 2 is electrically connected to the circuit board 50 via the pair of conductive patterns 56 as shown in FIG. 8. Each conductive pattern 56 is made of copper. Hereinafter, the connection between the antenna module 1 and the circuit board 50 by the wire 55 is referred to as a wire connection.

Figure 12:
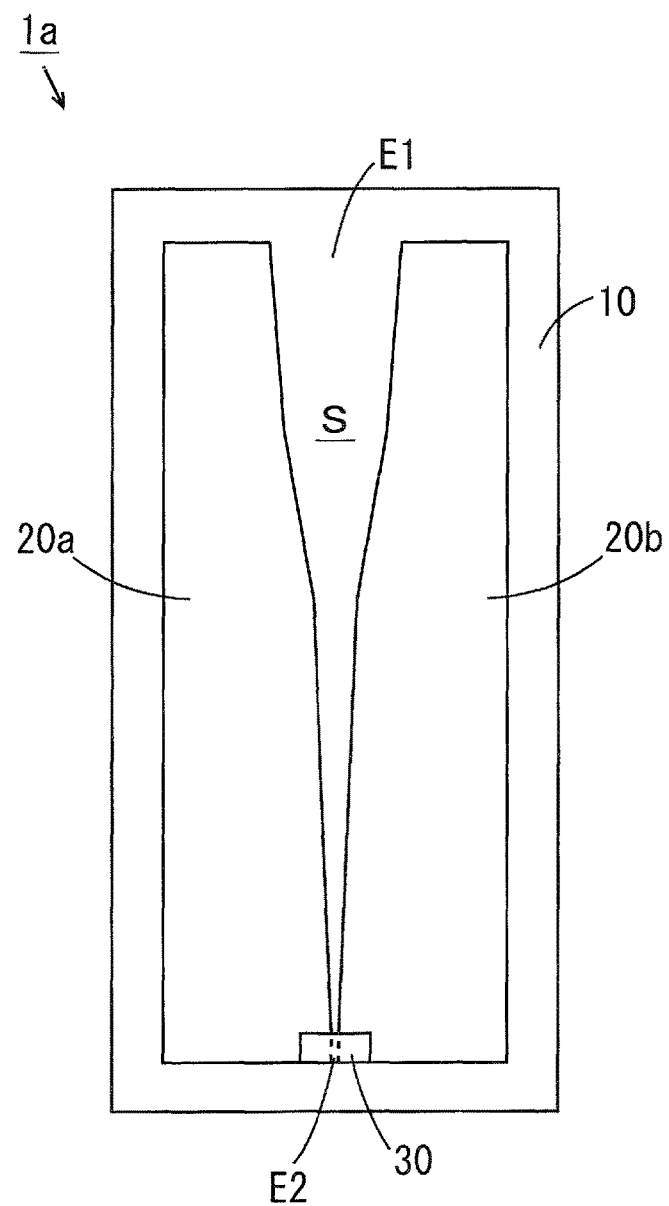
FIG. 12 is a schematic plan view for explaining the antenna module of the comparative example.

FIG. 12 is a schematic plan view for explaining the antenna module of the comparative example. As shown in FIG. 12, the antenna module 1a of the comparative example has the same configuration as the antenna module 1 of the inventive examples 1 and 2 except for that the slits SL1, SL2 are not formed at the electrodes 20a, 20b. The antenna module 1a of the comparative example is electrically connected to the circuit board 50 by the wire connection similarly to the antenna module 1 of the inventive example 1.

(b) Transmission Characteristics

Figure 13:
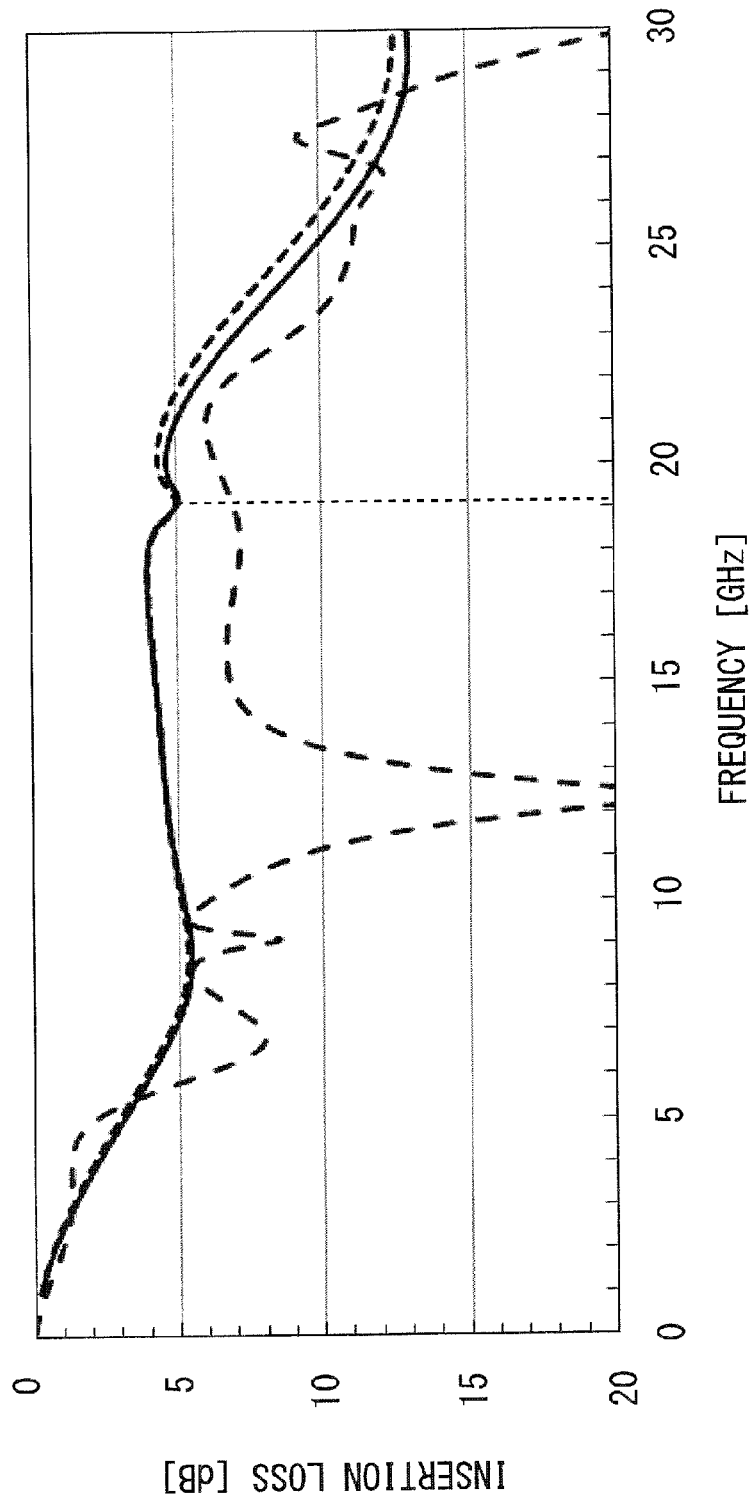
FIG. 13 is a diagram showing the simulation results of the transmission characteristics.

Regarding the antenna modules 1, 1a of the inventive examples 1, 2 and the comparative example, the transmission characteristics (the pass characteristics) of a signal was found by the electromagnetic field simulation. FIG. 13 is a diagram showing the simulation results of the transmission characteristics. In FIG. 13, the ordinate indicates an insertion loss [dB]. The lower the insertion loss is, the higher the transmission characteristics are. The abscissa indicates a frequency [GHz] of a transmitted signal (a base band signal).

As shown in FIG. 13, the simulation results in the inventive example 1 and the simulation results in the inventive example 2 are substantially the same. In the inventive examples 1 and 2, in a frequency band of not more than about 9 GHz, as the frequency increases, the insertion loss gradually increases, and the insertion loss is kept substantially constant in a frequency band of not less than about 9 GHz and not more than about 20 GHz. In a frequency band of not more than 20 GHz, the insertion loss reaches its maximum at about 9 GHz, and the maximum value is about 5.3 dB. Further, the peak of the insertion loss appears in a frequency band around 19 GHz, and the insertion loss increases to about 5 dB. In a frequency band of not less than about 20 GHz, as the frequency increases, the insertion loss gradually increases.

In the comparative example, the insertion loss widely fluctuates due to the frequency band. Further, in a frequency band of not less than 10 GHz and not more than 15 GHz, the high peak of the insertion loss appears, and the insertion loss markedly increases. In particular, in the frequency band around 12.5 Hz, the insertion loss increases to about 22 dB.

The frequency band of not less than 10 GHz and not more than 15 GHz corresponds to the data transfer rate of not less than 20 Gbps and not more than 30 Gbps. Therefore, when the transfer rate of the signal SG is not less than 20 Gbps and not more than 30 Gbps, the transmission characteristics in the frequency band of not less than 10 GHz and not more than 15 GHz is required to be kept high.

Figure 14:
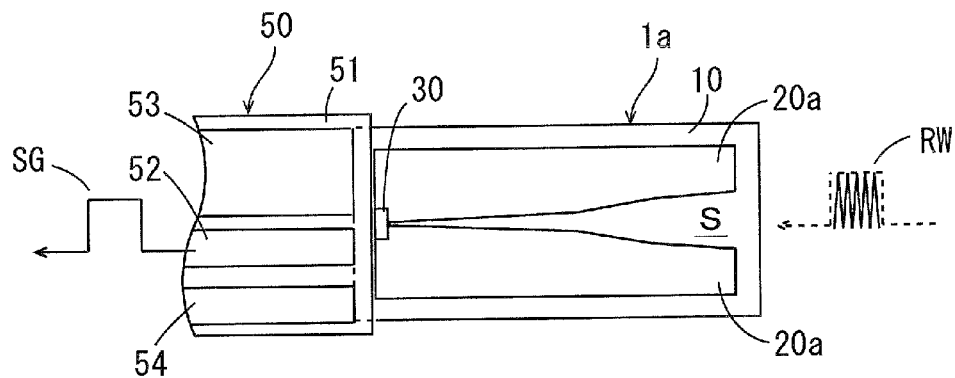
FIGS. 14(a) to 14(c) are diagrams for explaining the deterioration of the transmission characteristics in the comparative example.
Figure 14:
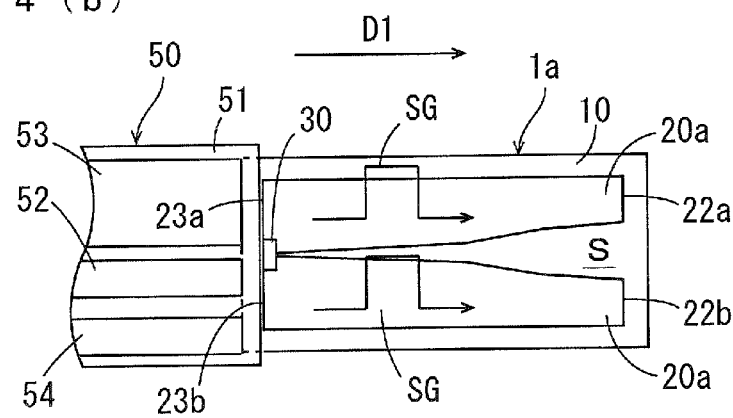
Figure 14:
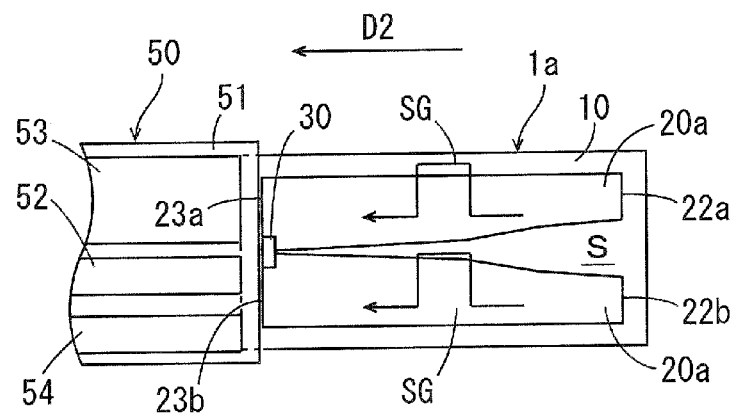

In the comparative example, the reason why the transmission characteristics are markedly deteriorated in the frequency band of not less than 10 GHz and not more than 15 GHz is considered as below. FIGS. 14(a) to 14(c) are diagrams for explaining deterioration of the transmission characteristics in the comparative example.

As shown in FIG. 14(a), when the electromagnetic wave RW is received at the antenna module 1a of the comparative example, the semiconductor device 30 performs detection and rectification, and the signal SG output from the semiconductor device 30 is transmitted through the signal transmission line 52 and the ground line 53 of the circuit board 50 as described above.

In this case, part of the signal SG output from the semiconductor device 30 is transmitted in a direction D1 from the mount end E2 (FIG. 1) toward the opening end E1 (FIG. 1) through the electrodes 20a, 20b as shown in FIG. 14(b). Because the slits SL1, SL2 are not formed at the electrodes 20a, 20b in the antenna module 1a of the comparative example, the signal SG transmitted in the direction D1 is transmitted to the end surfaces 22a, 22b of the electrodes 20a, 20b and reflected at those end surfaces 22a, 22b. The reflected signal SG is transmitted in a direction D2 from the opening end E1 (FIG. 1) toward the mount end E2 (FIG. 1) through the electrodes 20a, 20b as shown in FIG. 14(c). Thus, in the electrodes 20a, 20b, the signal SG transmitted in the direction D1 and the signal SG transmitted in the direction D2 interfere with each other.

Theoretically, in a case in which the length of the electrodes 20a, 20b (the total of the lengths L1, L2, L3 of FIG. 11) in a direction parallel to the central axis SE of FIG. 1 (a direction parallel to the directions D1, D2) matches one fourth of the wavelength λs of the transmitted signal SG, the signal SG transmitted in the direction D1 and the signal SG transmitted in the direction D2 cancel each other out. Thus, the transmission characteristics at a frequency that corresponds to the wavelength λs are deteriorated. The length of the electrode 20a, 20b in the comparative example is 6.7 mm. Therefore, when the signal SG having the wavelength λs of 6.7×4=26.8 mm is transmitted, the signal SG transmitted in the direction D2 and the signal SG transmitted in the direction D1 cancel each other out. The frequency of the signal SG having the wavelength λs of 26.8 mm is about 10 GHz. Therefore, as described above, it is considered that the transmission characteristics are deteriorated in the frequency band of not less than 10 GHz and not more than 15 GHz.

In contrast, because the slits SL1, SL2 are formed at the electrodes 20a, 20b in the inventive examples 1 and 2 the interference with the signal SG at the electrodes 20a, 20b as described above occurs only in the regions R2a, R2b. That is, the interference with the signal SG occurs between the end surfaces 23a, 23b of the regions R2a, R2b and the end surface that extends along the slits SL1, SL2. In this case, in a case in which the wavelength λs of the signal SG is four times of the distance between the end surfaces 23a, 23b of the regions R2a, R2b and the end surface along the slits SL1, SL2, the signal SG transmitted in the direction D2 and the signal SG transmitted in the direction D1 cancel each other out. When the maximum value of the distance between the end surfaces 23a, 23b and the end surface along the slits SL1, SL2 is 0.7525 mm, the signals SG having the wavelength λs of 3.1 mm cancel each other out. The frequency of the signal SG having the wavelength λs of 3.1 mm is about 100 GHz. Therefore, it is considered that significant deterioration of the transmission characteristics occurs in the frequency band that is sufficiently higher than the frequency of not less than 10 GHz and not more than 15 GHz.

Thus, the slits SL1, SL2 are formed at the electrodes 20a, 20b, whereby the transfer of the signal SG from the regions R2a, R2b to the regions R1a, R1b of the electrodes 20a, 20b is blocked. Thus, the frequency band in which the transmission characteristics are deteriorated is shifted to a higher region. Therefore, deterioration of the transmission characteristics of the signal SG in a desired frequency band can be suppressed.

(c) Antenna Gain

Figure 15:
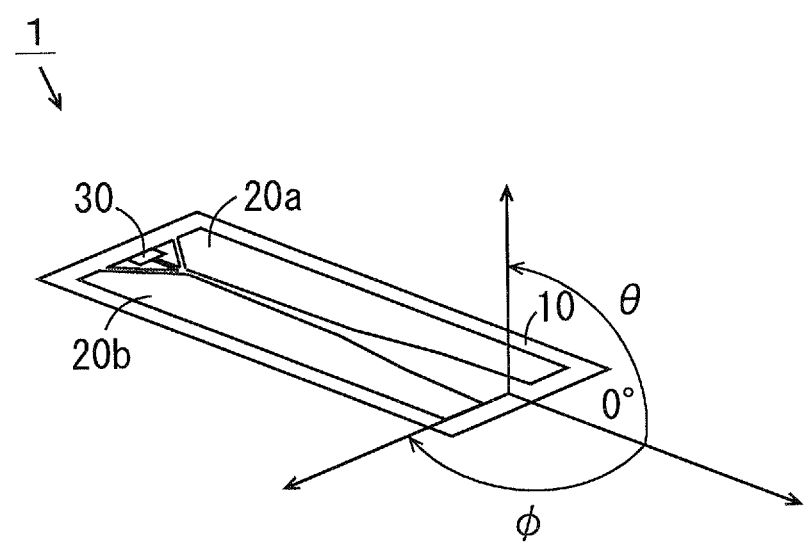
FIG. 15 is a diagram for explaining the radiation angle of the antenna module in the simulation.

Regarding the antenna module 1 of the above-mentioned inventive example 1 the antenna gain obtained at the time of transmission operation was found by the electromagnetic field simulation. FIG. 15 is a diagram for explaining the radiation angle of the antenna module 1 by the simulation. In FIG. 15, the central axis direction of the antenna module 1 is considered as 0°. Further, a plane parallel to the main surface of the base layer 10 is referred to as a parallel plane, and a plane vertical to the main surface of the base layer 10 is referred to as a vertical plane. An angle formed in the parallel plane with the central axis direction is referred to as an azimuth angle ϕ, and an angle formed in the vertical plane with the central axis direction is referred to as an elevation angle θ.

Figure 16:
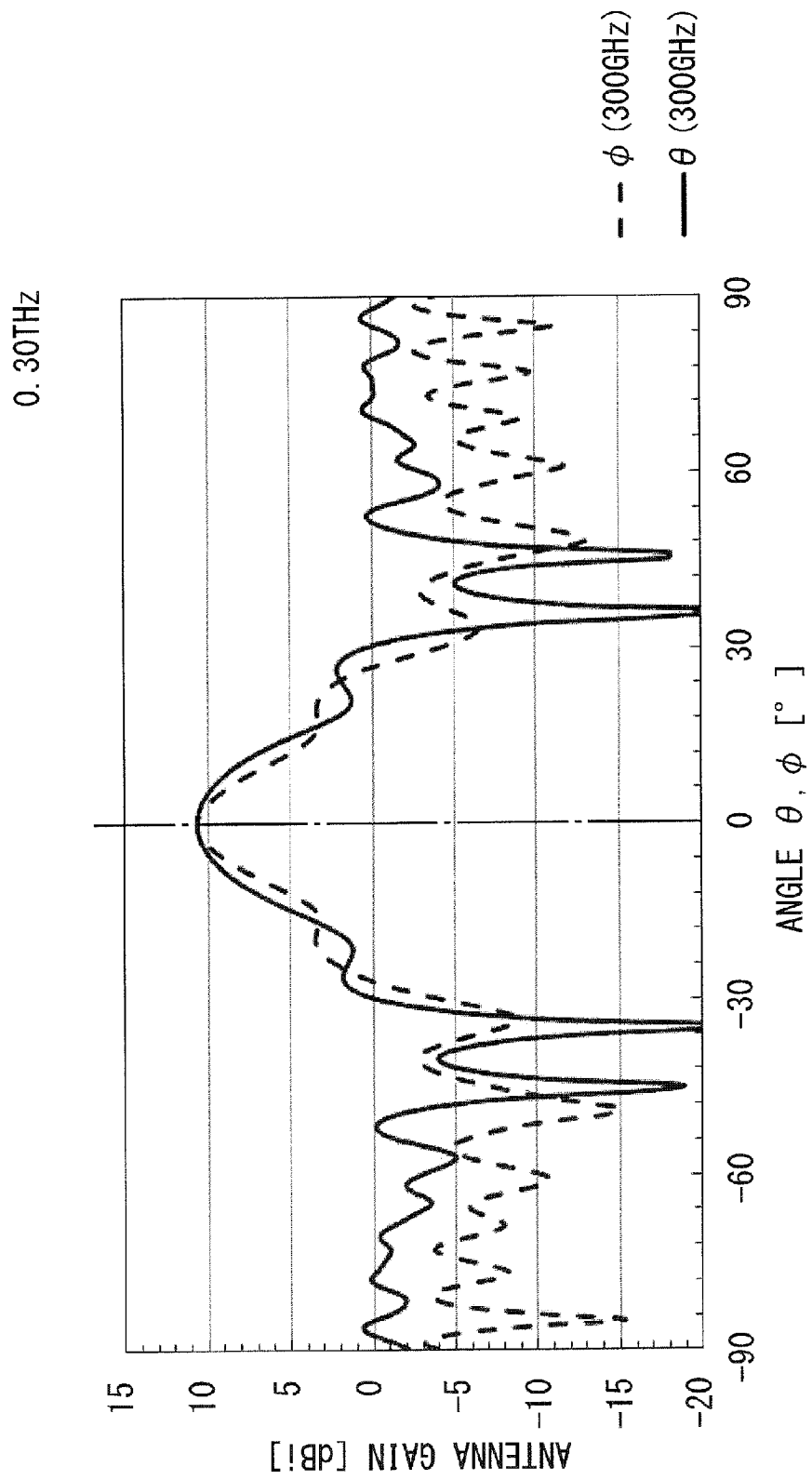
FIG. 16 is a diagram showing the simulation results of the antenna gain obtained at the time of transmission of an electromagnetic wave of 0.30 THz.
Figure 17:
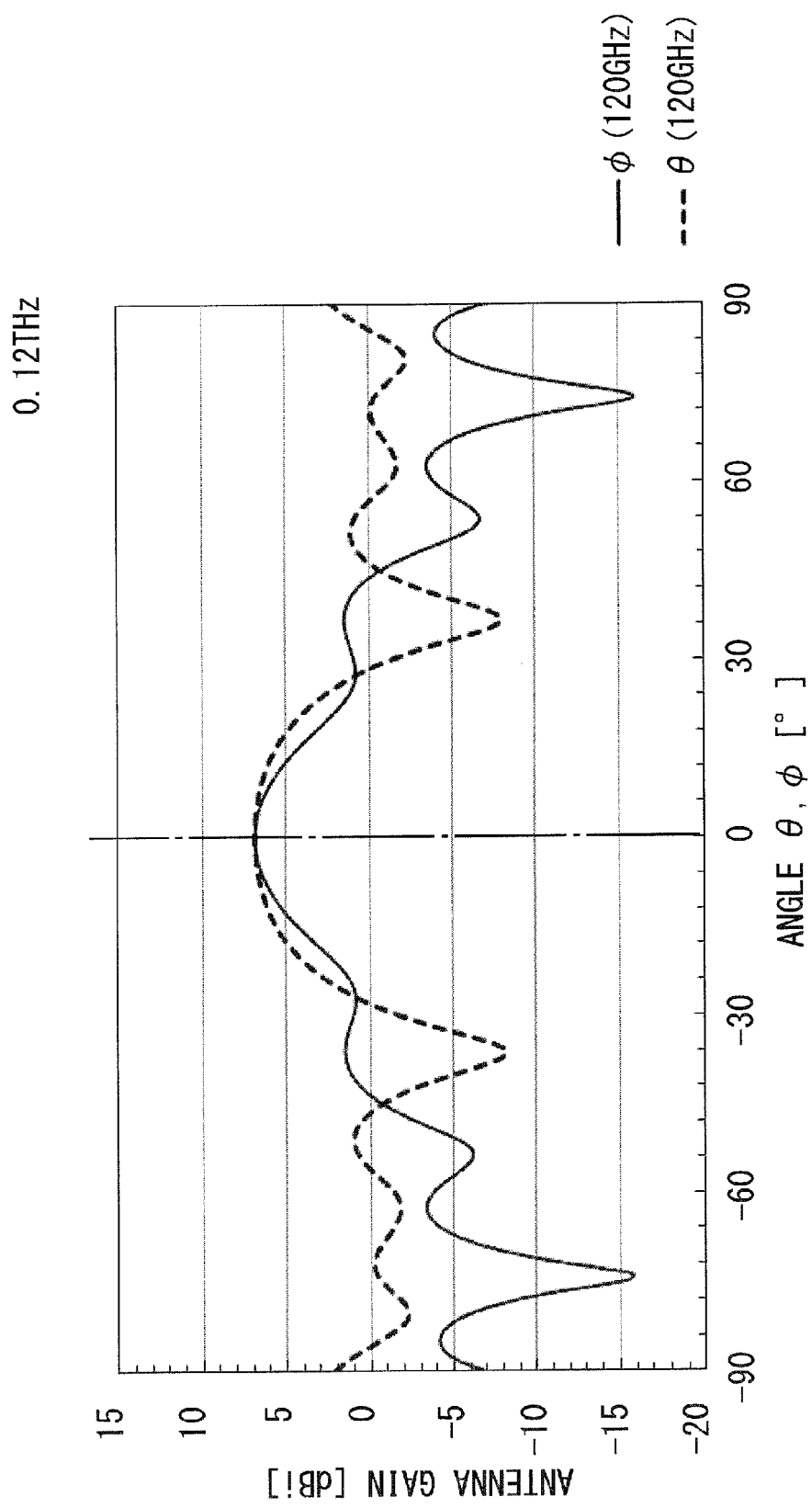
FIG. 17 is a diagram showing the simulation results of the antenna gain obtained at the time of transmission of the electromagnetic wave of 0.12 THz.

FIG. 16 is a diagram showing the simulation results of the antenna gain at the time of transmission of the electromagnetic wave of 0.30 THz. FIG. 17 is a diagram showing the simulation results of the antenna gain at the time of transmission of the electromagnetic wave of 0.12 THz. In FIGS. 16 and 17, the ordinates indicate the antenna gain [dBi], and the abscissas indicate the azimuth angle ϕ or the elevation angle θ.

As shown in FIGS. 16 and 17, either at the time of transmission of the electromagnetic wave of 0.30 THz or at the time of transmission of the electromagnetic wave of 0.12 THz, the antenna gain reaches its maximum in a direction in which the azimuth angle ϕ and the elevation angle θ are 0°. Thus, it is found that the antenna module 1 has the directivity in the central axis direction.

Further, the maximum value of the antenna gain is about 10.6 dBi at the time of transmission of the electromagnetic wave of 0.30 THz as shown in FIG. 16, and the maximum value of the antenna gain is about 6.9 dBi at the time of transmission of the electromagnetic wave of 0.12 THz as shown in FIG. 17.

(d) Inventive Examples 3 to 5

Regarding the antenna module 1 of the inventive examples 3 to 5 difference from the antenna module 1 of the above-mentioned inventive example 1 will be described.

The antenna module 1 of the inventive example 3 has the same configuration as the antenna module 1 in the above-mentioned inventive example 1 except that the widths of the slits SL1, SL2 are respectively set to 10 µm, and is connected to the circuit board 50 by the wire connection similarly to the antenna module 1 of the inventive example 1.

Figure 18:
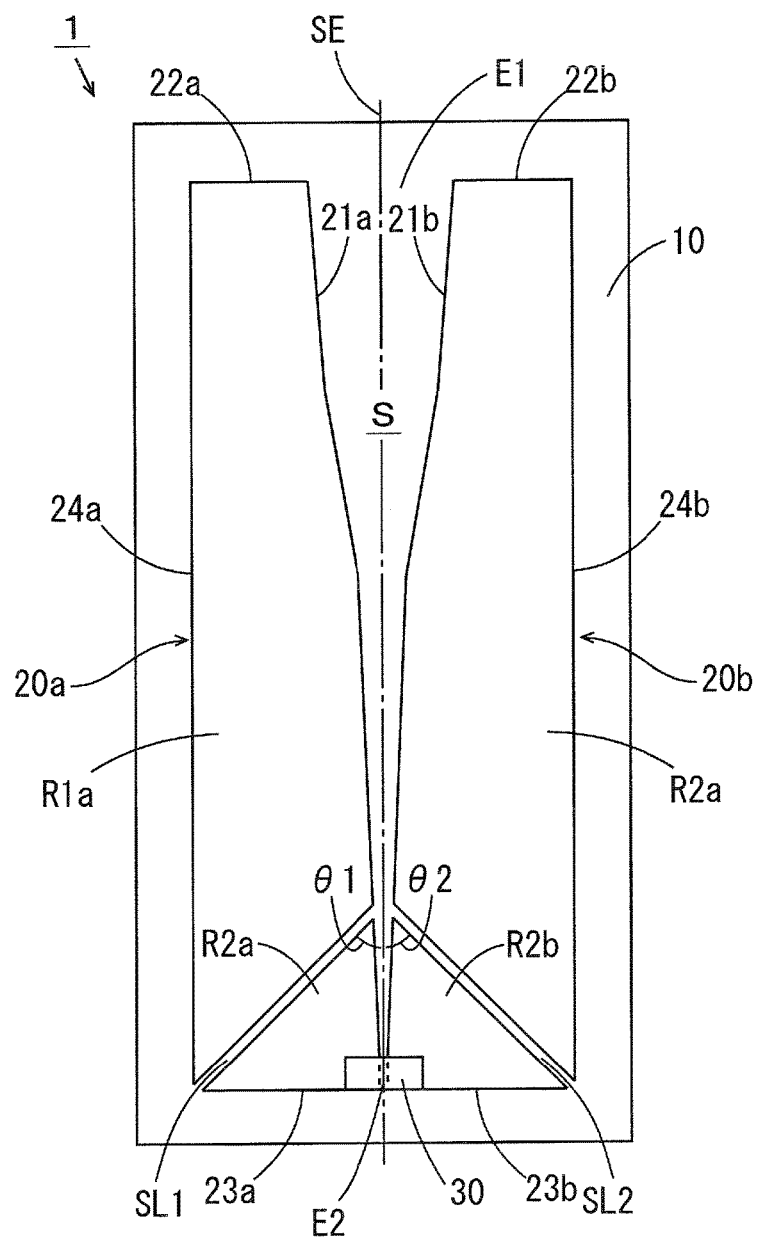
FIG. 18 is a schematic plan view for explaining the antenna module of the inventive examples 4 and 5.

FIG. 18 is a schematic plan view for explaining the antenna module 1 of the inventive examples 4 and 5. As shown in FIG. 18, in the antenna module 1 of the inventive examples 4 and 5, the one end of the slit SL1 is positioned at a boundary portion (hereinafter referred to as a corner of the electrode 20a) between the end surface 23a and the side surface 24a of the electrode 20a, and the one end of the slit SL2 is positioned at a boundary portion (hereinafter referred to as a corner of the electrode 20b) between the end surface 23b and the side surface 24b of the electrode 20b. An angle θ1 of the slit SL1 with the central axis SE and an angle θ2 of the slit SL2 with the central axis SE are respectively 45° similarly to the inventive example 1.

The widths of the slits SL1, SL2 are respectively set to 50 µm in the antenna module 1 of the inventive example 4 and the widths of the slits SL1, SL2 are respectively set to 10 µm in the antenna module 1 of the inventive example 5. The antenna module 1 of the inventive examples 4 and 5 is connected to the circuit board 50 by the wire connection similarly to the antenna module 1 of the inventive example 1.

(e) Transmission Characteristics

Figure 19:
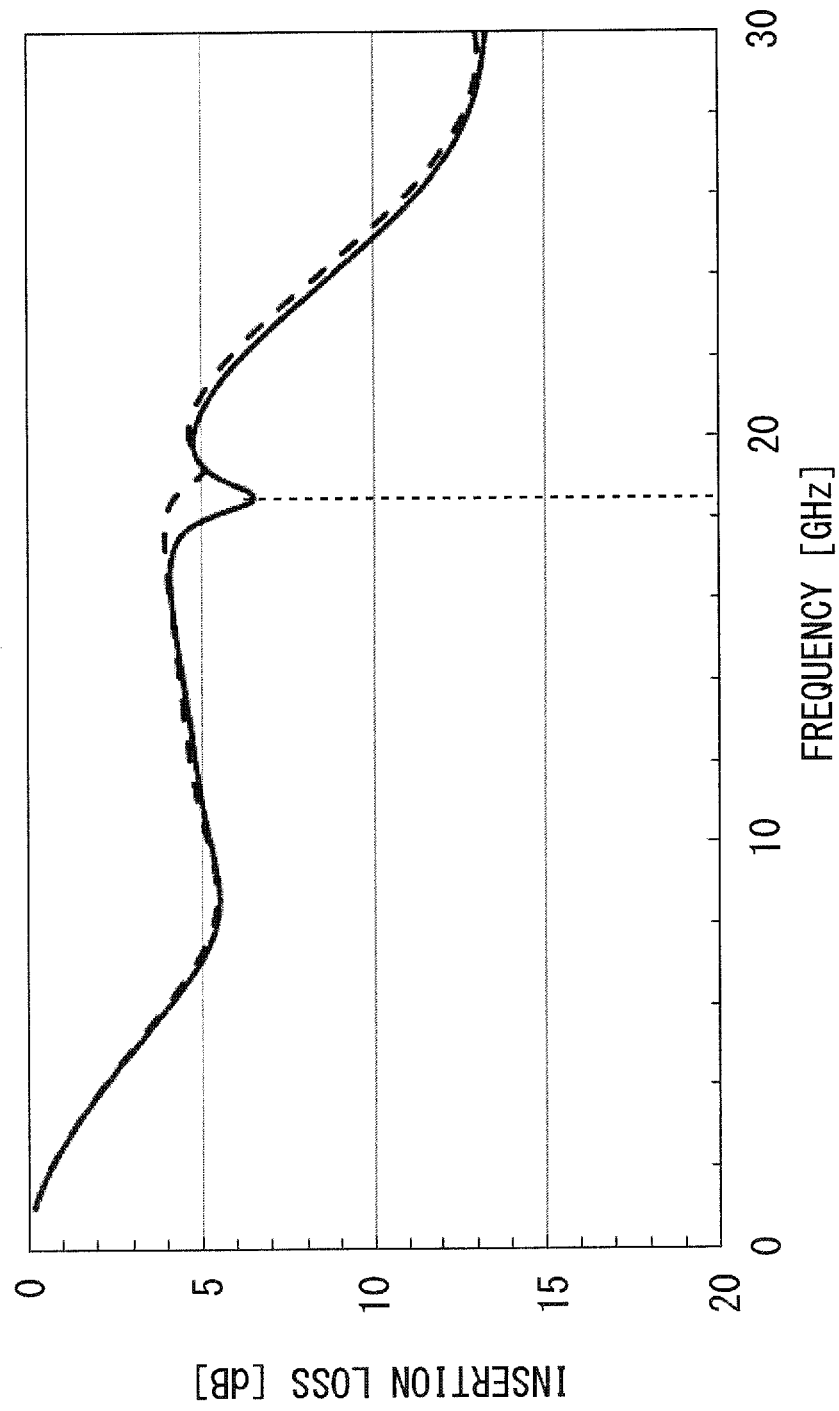
FIG. 19 is a diagram showing the simulation results of the transmission characteristics in the inventive example 3.
Figure 20:
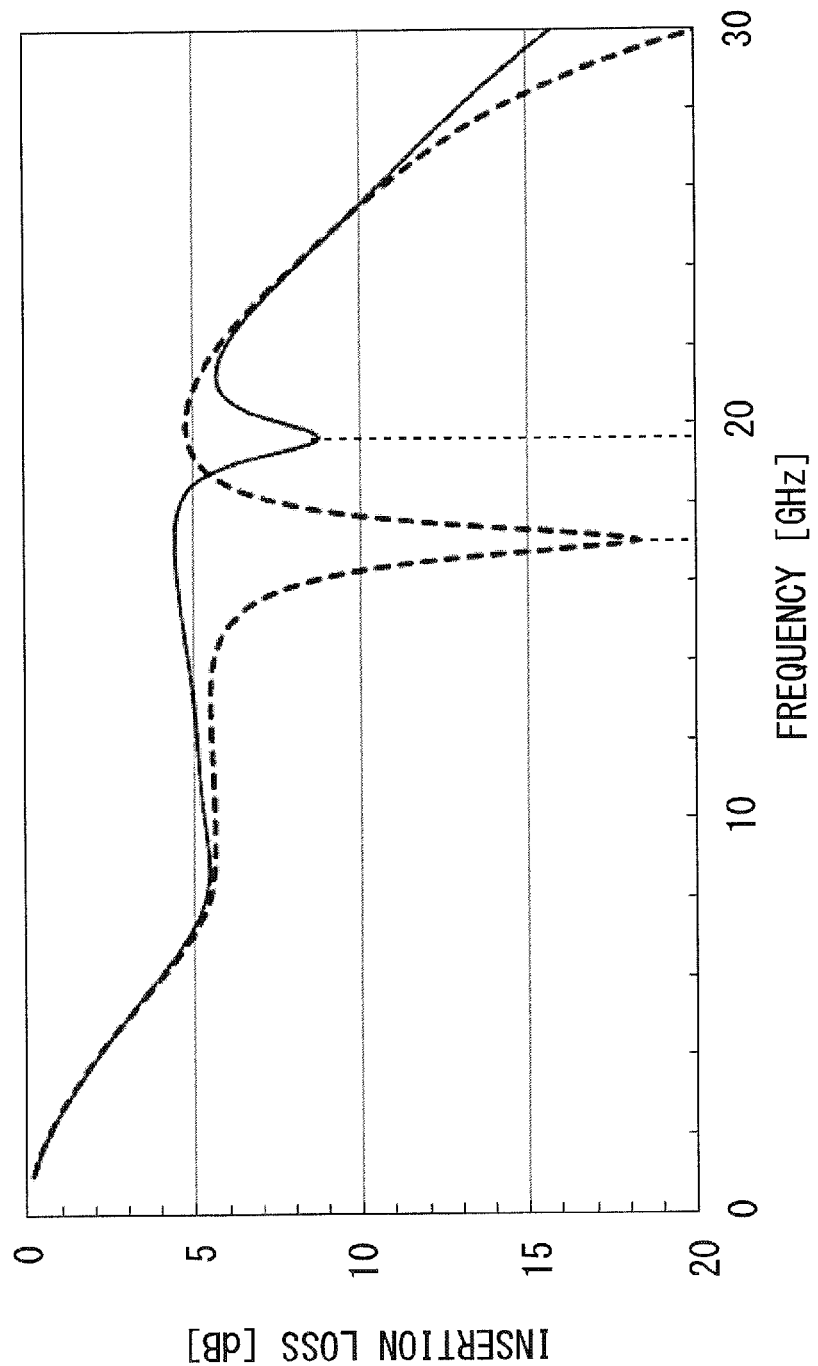
FIG. 20 is a diagram showing the simulation results of the transmission characteristics in the inventive examples 4 and 5.

Regarding the antenna modules 1 of the inventive examples 3 to 5 the transmission characteristics (the pass characteristics) of a signal was found by the electromagnetic field simulation. FIG. 19 is a diagram showing the simulation results of the transmission characteristics in the inventive example 3. In FIG. 19, the simulation results of the transmission characteristics in the inventive example 1 are shown for comparison. FIG. 20 is a diagram showing the simulation results of the transmission characteristics in the inventive examples 4 and 5. In FIGS. 19 and 20, the ordinates indicate the insertion loss [dB], and the abscissas indicate the frequency [GHz] of the transmitted signal (a base band signal). Regarding the simulation results of the transmission characteristics in the inventive examples 3 to 5, difference from the simulation results of the transmission characteristics in the inventive example 1 will be described.

As shown in FIG. 19, in the inventive example 3, the peak of the insertion loss appears in the frequency band around 18.5 GHz, and the insertion loss increases to about 6.5 dB.

As shown in FIG. 20, in the inventive example 4, the peak of the insertion loss appears in the frequency band around 19.5 GHz, and the insertion loss increases to about 8.7 dB. In the inventive example 5, the peak of the insertion loss appears in the frequency band around 17 GHz, and the insertion loss increases to about 18.3 dB.

Thus, it is found that when the one end of the slit SL1 and the one end of the slit SL2 are respectively positioned substantially at the center of the end surfaces 23a, 23b of the electrodes 20a, 20b, the maximum value of the insertion loss obtained in a frequency band of not more than 20 GHz is lower than the maximum value of the insertion loss obtained when the one end of the slit SL1 and the one end of the slit SL2 are respectively positioned at the corner of the electrodes 20a, 20b.

Further, in each of the cases in which the one end of the slit SL1 and the one end of the slit SL2 are respectively positioned substantially at the center of the end surfaces 23a, 23b of the electrodes 20a, 20b, and are respectively positioned at the corner of the electrodes 20a, 20b, it is found that when the widths of the slits SL1, SL2 are respectively 50 µm, the maximum value of the insertion loss obtained in a frequency band of not less than 15 GHz and not more than 20 GHz is lower than the maximum value of the insertion loss obtained when the widths of the slits SL1, SL2 are respectively 10 µm.

Further, in each of the cases in which the one end of the slit SL1 and the one end of the slit SL2 are respectively positioned substantially at the center of the end surfaces 23a, 23b of the electrodes 20a, 20b, and are respectively positioned at the corner of the electrodes 20a, 20b, it is found that when the widths of the slits SL1, SL2 are respectively 50 µm, the peak of the insertion loss appears in the higher frequency band than when the widths of the slits SL1, SL2 are respectively 10 µm.

(f) Antenna Gain of Antenna Module

Regarding the antenna module 1 of the above-mentioned inventive examples 3 to 5 the antenna gain at the time of transmission operation was found by the electromagnetic field simulation. Here, the antenna gain at the time of transmission of the electromagnetic wave of 0.30 THz was found.

Figure 21:
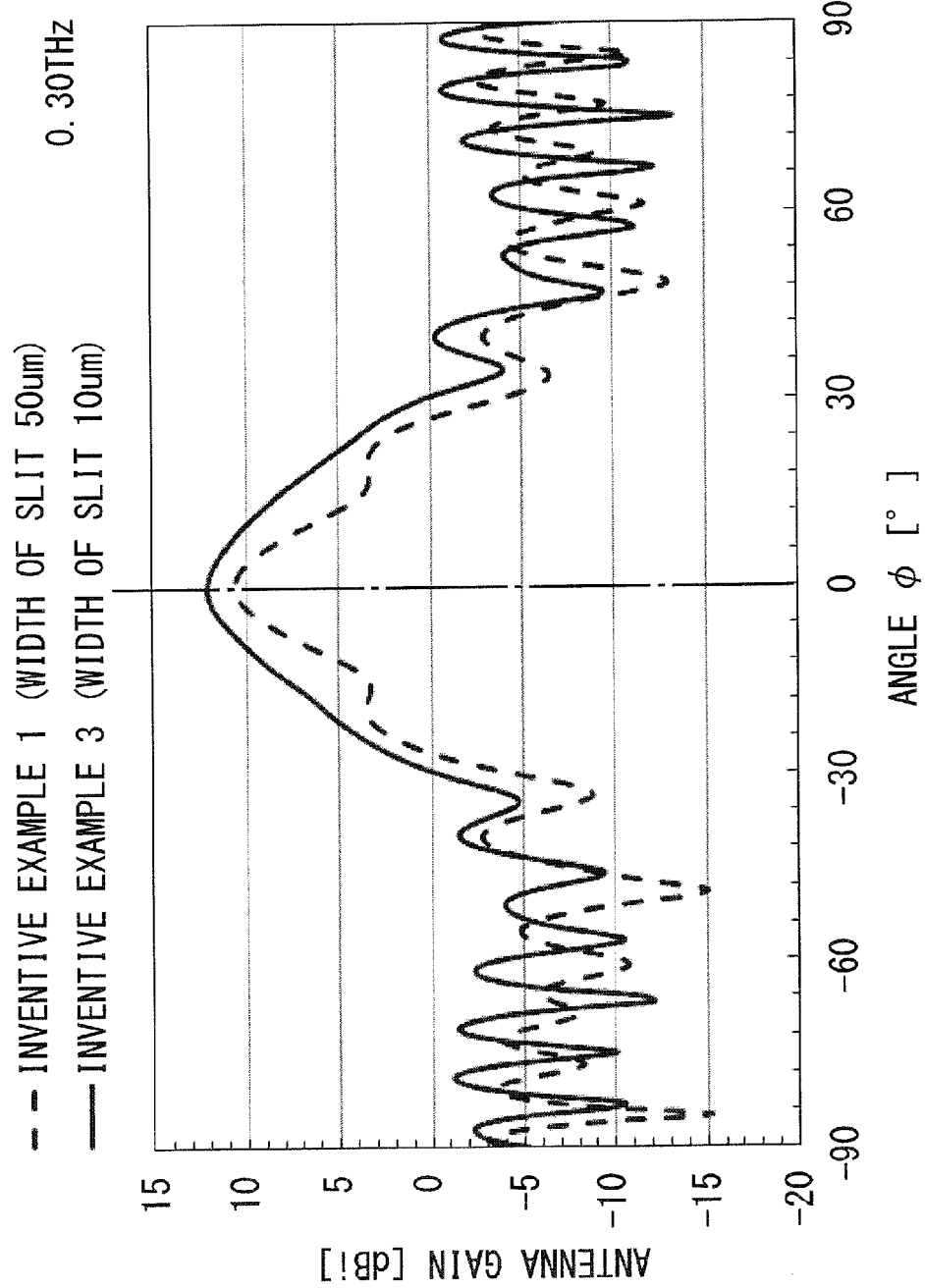
FIG. 21 is a diagram showing the simulation results of the antenna gain in the inventive example 3.

FIG. 21 is a diagram showing the simulation results of the antenna gain in the inventive example 3. The simulation results of the antenna gain in the inventive example 1 is also shown in FIG. 21 for comparison. FIG. 22 is a diagram showing the simulation results of the antenna gain in the inventive examples 4 and 5. The ordinates of FIGS. 21 and 22 indicate the antenna gain [dBi], and the obscissas indicate the azimuth angle φ. Regarding the simulation results of FIGS. 21 and 22, difference from the simulation results (FIG. 15) of the antenna gain in the inventive example 1 will be described.

As shown in FIGS. 21 and 22, in any of the inventive examples 3 to 5 the antenna gain reaches its maximum in a direction in which the azimuth angle φ is substantially 0°. Thus, it is found that the antenna module 1 of the inventive examples 3 to 5 has the directivity in the central axis direction similarly to the antenna module 1 of the inventive examples 1 and 2.

Further, the maximum value of the antenna gain is about 1.06 dBi in the inventive example 1 as shown in FIG. 21, whereas the maximum value of the antenna value is about 12.1 dBi in the inventive example 3. Thus, in a case in which the one end of the slit SL1 and the one end of the slit SL2 are positioned substantially at the center of the end surfaces 23a, 23b of the electrodes 20a, 20b, it is found that when the widths of the slit SL1, SL2 are respectively 10 µm, the antenna gain is higher than the antenna gain obtained when the widths of the slit SL1, SL2 are respectively 50 µm.

As shown in FIG. 22, the maximum value of the antenna gain is about 10.5 dBi in the inventive example 4, and the maximum value of the antenna gain is about 11.7 dBi in the inventive example 5. Thus, even in a case in which the one end of the slit SL1 and the one end of the slit SL2 are positioned at the corner of the electrodes 20a, 20b, it is found that when the widths of the slit SL1, SL2 are respectively 10 µm, the antenna gain is higher than the antenna gain obtained when the widths of the slits SL1, SL2 are respectively 50 µm.

Further, as shown in FIGS. 21 and 22, the maximum value of the antenna gain in the inventive example 1 and the maximum value of the antenna gain in the inventive example 4 are substantially equal, and the maximum value of the antenna gain in the inventive example 3 and the maximum value of the antenna gain in the inventive example 5 are substantially equal. Thus, it is found that the antenna gain depends more on the widths of the slit SL1, SL2 than the positions of the slits SL1, SL2, and the smaller the widths of the slits SL1, SL2 are, the higher the antenna gain is.

(1-5) Effects of First Embodiment

In this manner, in the antenna module 1 according to the first embodiment, the slits SL1, SL2 are formed at the electrodes 20a, 20b, whereby the transfer of the signal SG from the regions R2a, R2b to the regions R1a, R1b of the electrodes 20a, 20b is blocked. Thus, the frequency band in which the transmission characteristics are deteriorated is shifted to a higher region. Further, the frequency band in which the transmission characteristics are deteriorated is different depending on the positions and the widths of the slits SL1, SL2. Thus, the positions and the widths of the slits SL1, SL2 are adjusted, whereby the frequency band in which the transmission characteristics are deteriorated can be adjusted. Therefore, deterioration of the transmission characteristics of the signal SG in a desired frequency band can be suppressed.

(2) Second Embodiment

Figure 23:
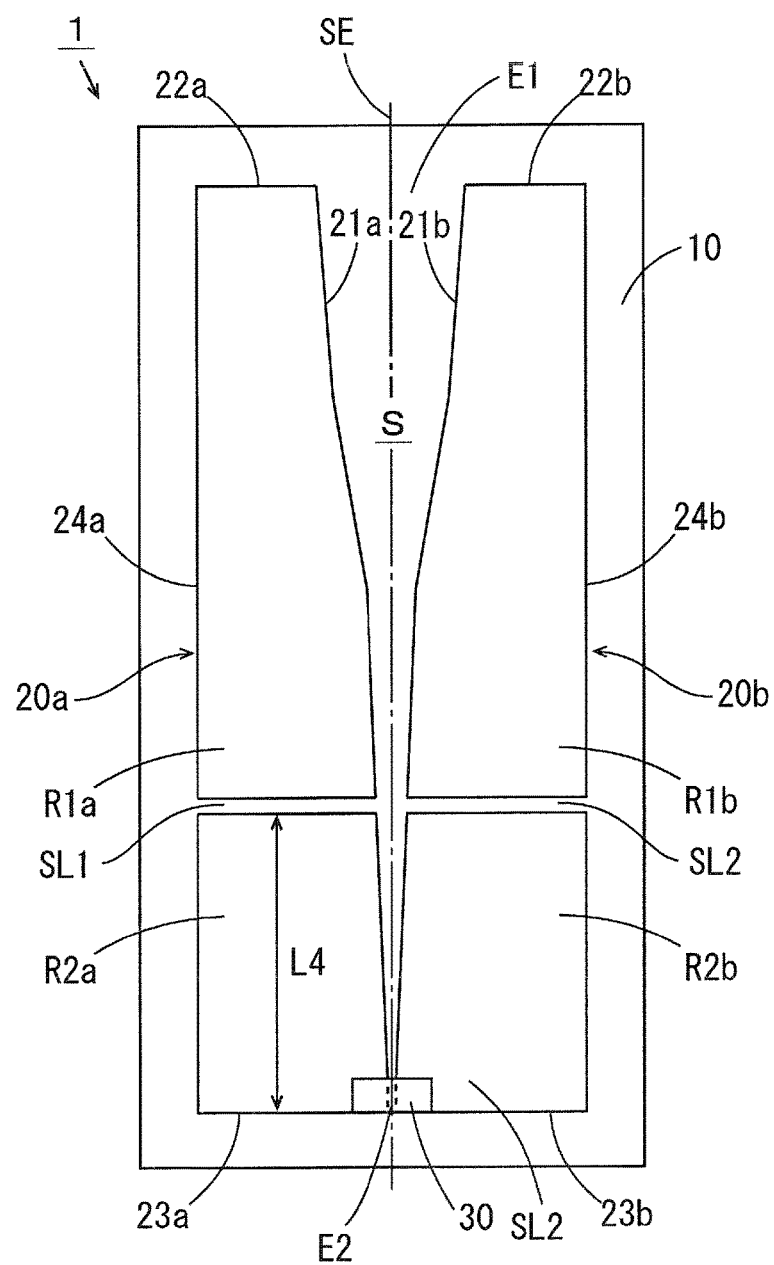
FIG. 23 is a schematic plan view of the antenna module according to the second embodiment of the present invention.

FIG. 23 is a schematic plan view of the antenna module 1 according to the second embodiment of the present invention. Regarding the antenna module 1 of FIG. 23, difference from the antenna module 1 according to the above-mentioned first embodiment will be described.

In the antenna module 1 of FIG. 23, the slits SL1, SL2 are formed at the electrodes 20a, 20b to respectively extend on a common straight line vertical to the central axis SE of the tapered slot S.

(2-1) Characterization of Antenna Module

Characteristics of the antenna module 1 according to the second embodiment was evaluated by the simulation.

(a) Inventive Examples 6 to 12

Except that the slits SL1, SL2 are formed as shown in FIG. 23, the antenna module 1 of the inventive examples 6 to 12 has the same configuration as the antenna module 1 of the inventive example 1 and is connected to the circuit board 50 by the wire connection similarly to the antenna module 1 of the inventive example 1.

In the inventive example 6, the distance L4 (FIG. 23) from the end surfaces 23a, 23b to the slits SL1, SL2 of the electrodes 20a, 20b is 1 mm. The distance L4 is 1.5 mm in the inventive example 7, the distance L4 is 2 mm in the inventive example 8, the distance L4 is 2.5 mm in the inventive example 9, the distance L4 is 3 mm in the inventive example 10, the distance L4 is 3.5 mm in the inventive example 11 and the distance L4 is 4 mm in the inventive example 12. In the inventive examples 6 to 12 the widths of the slits SL1, SL2 are respectively 50 μm.

(b) Transmission Characteristics

Figure 24:
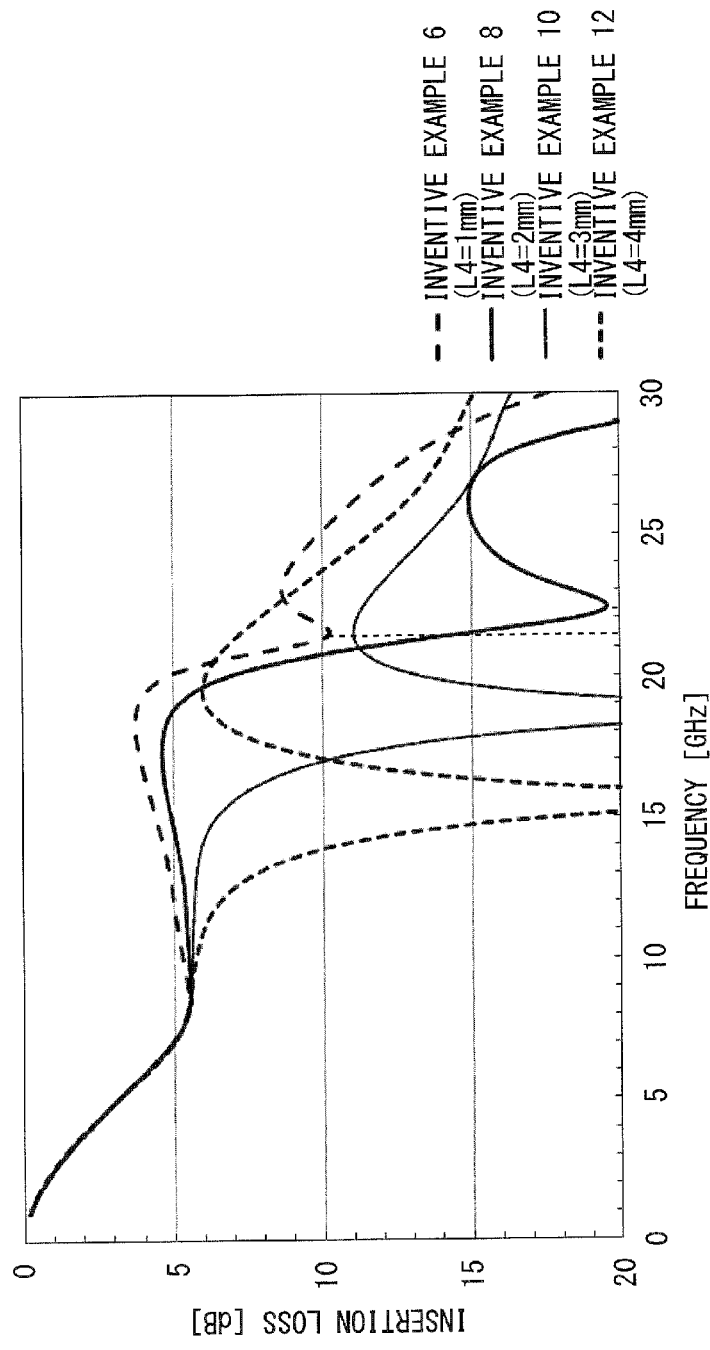
FIG. 24 is a diagram showing the simulation results of the transmission characteristics.

Regarding the antenna module 1 of the inventive example 6, the inventive example 8, the inventive example 10 and the inventive example 12, the transmission characteristics (the pass characteristics) of the signal was found by the electromagnetic field simulation. FIG. 24 is a diagram showing the simulation results of the transmission characteristics. In FIG. 24, the ordinate indicates the insertion loss [dB], and the abscissa indicates the frequency [GHz] of the transmitted signal (the base band signal). Regarding the simulation results of FIG. 24, difference from the simulation results of the transmission characteristics in the inventive example 1 will be described.

As shown in FIG. 24, in the inventive example 6, the peak of the insertion loss appears in the frequency band around 21.5 GHz, and the insertion loss increases to about 10.2 dB. In the inventive example 8, the peak of the insertion loss appears in the frequency band around 22.5 GHz, and the insertion loss increases to about 19.5 dB. In the inventive example 10, the peak of the insertion loss appears in the frequency band around 18.5 GHz, and the insertion loss increases to about 30.3 dB. In the inventive example 12, the peak of the insertion loss appears in the frequency band around 15.5 GHz, and the insertion loss increases to about 28.0 dB.

In this manner, even in the inventive examples 6, 8, 10 and 12, the transmission characteristics in the frequency band of not less than 10 GHz and not more than 15 GHz are improved as compared to the above-mentioned comparative example. In particular, in the inventive examples 6 and 8, the transmission characteristics are kept high in the frequency band of not more than 20 GHz.

Further, it is found that the smaller the distance L4 (FIG. 23) from the end surfaces 23a, 23b to the slits SL1, SL2 of the electrodes 20a, 20b is, the lower the peak value of the insertion loss is.

(c) Antenna Gain of Antenna Module

Regarding the antenna module 1 of the above-mentioned inventive examples 6 to 12, the antenna gain at the time of the transmission operation was found by the electromagnetic field simulation.

Figure 25:
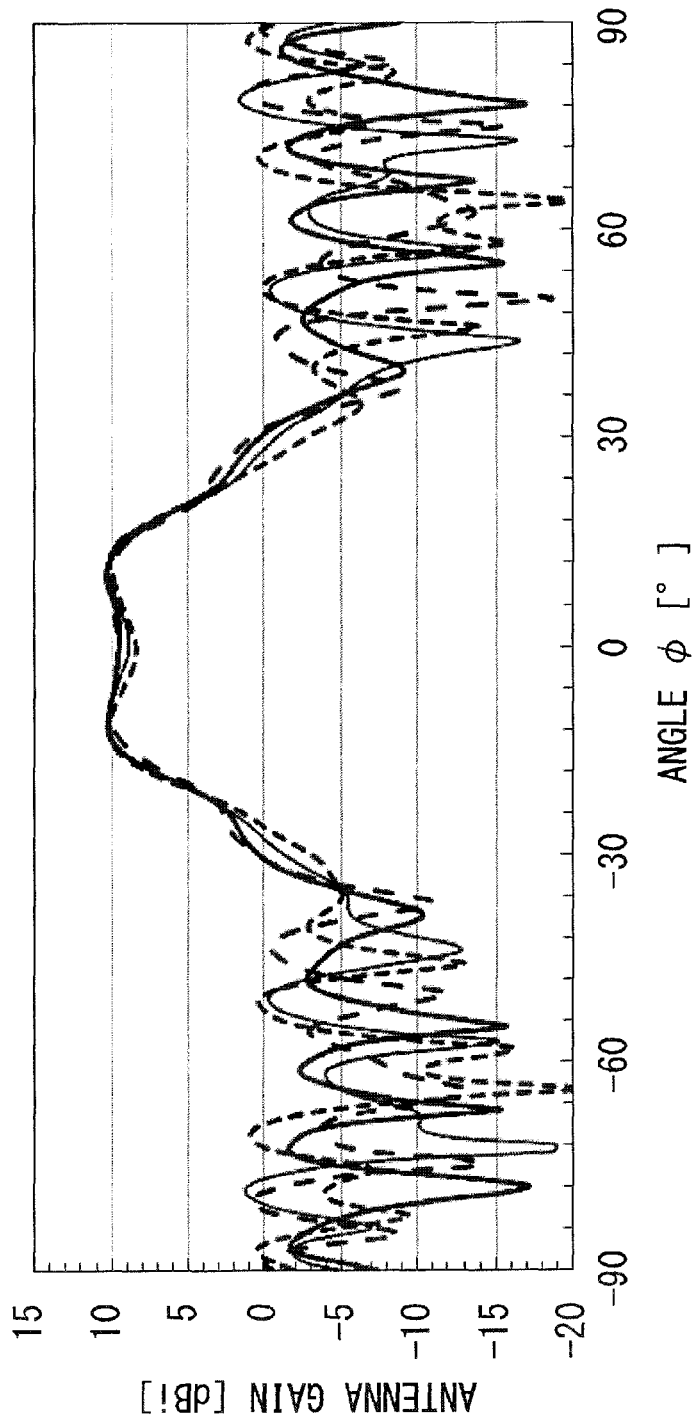
FIG. 25 is a diagram showing the simulation results of the antenna gain obtained at the time of transmission of the electromagnetic wave of 0.30 THz.
Figure 26:
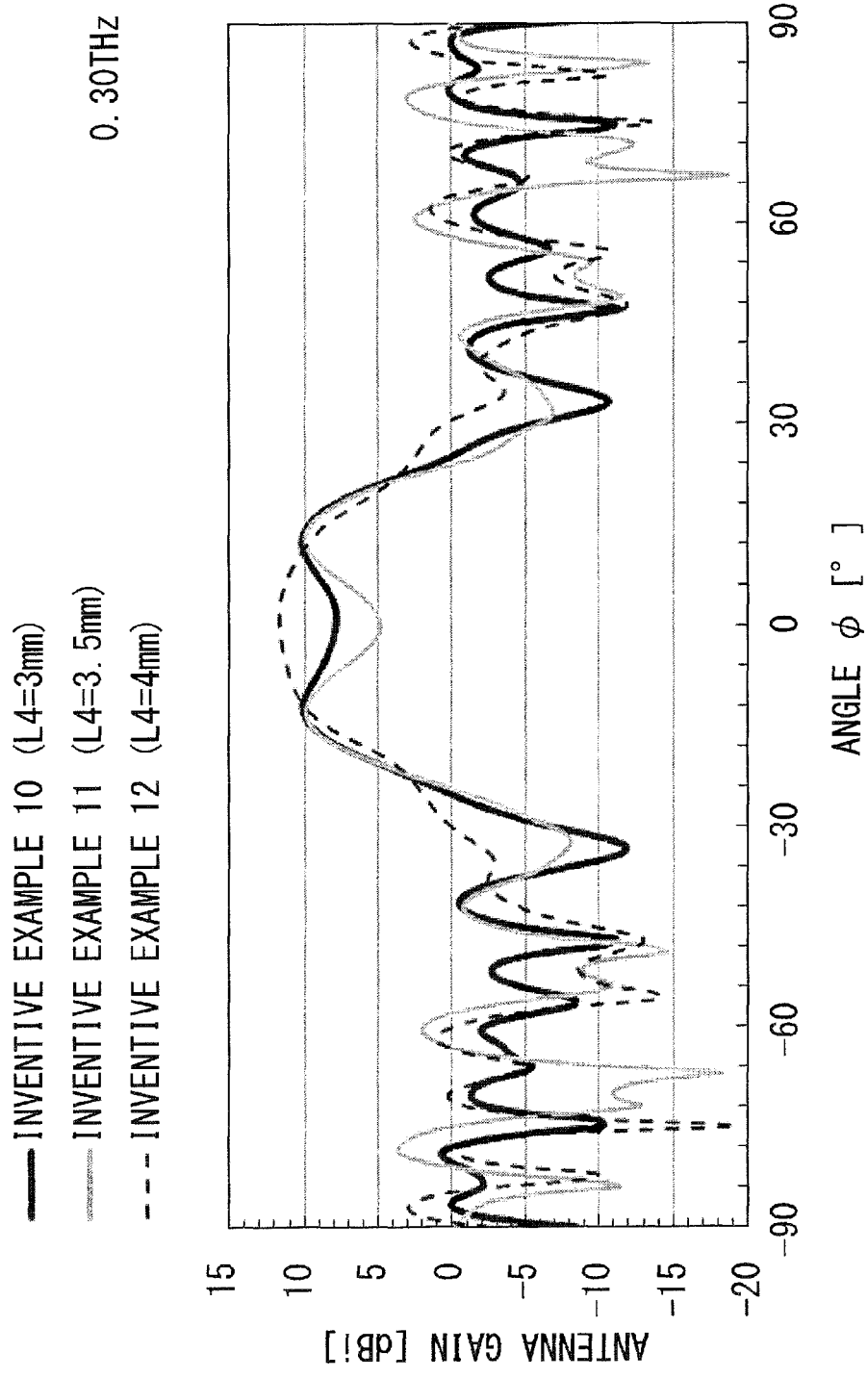
FIG. 26 is a diagram showing the simulation results of the antenna gain obtained at the time of transmission of the electromagnetic wave of 0.30 THz.
Figure 27:
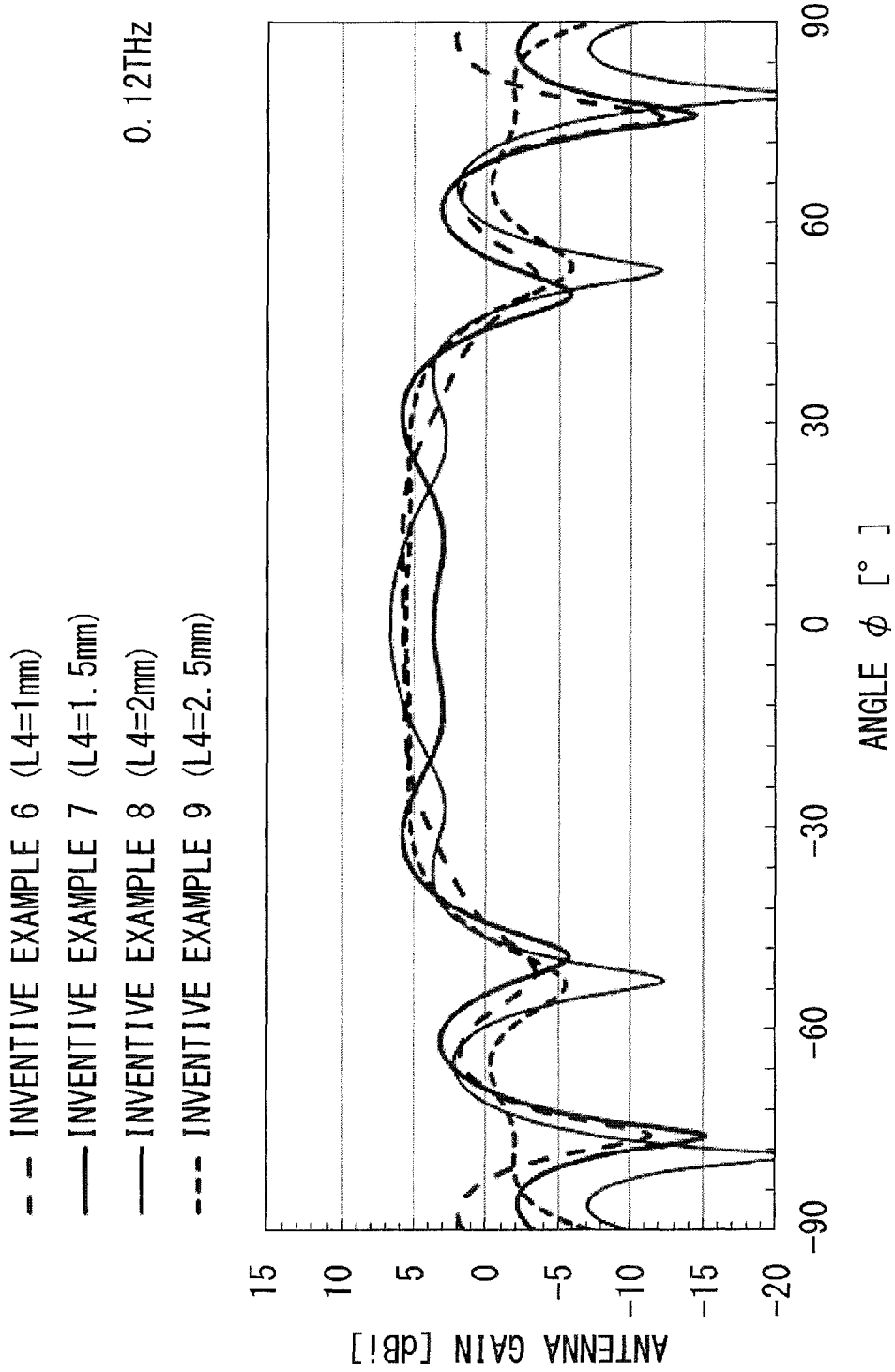
FIG. 27 is a diagram showing the simulation results of the antenna gain obtained at the time of transmission of the electromagnetic wave of 0.12 THz.
Figure 28:
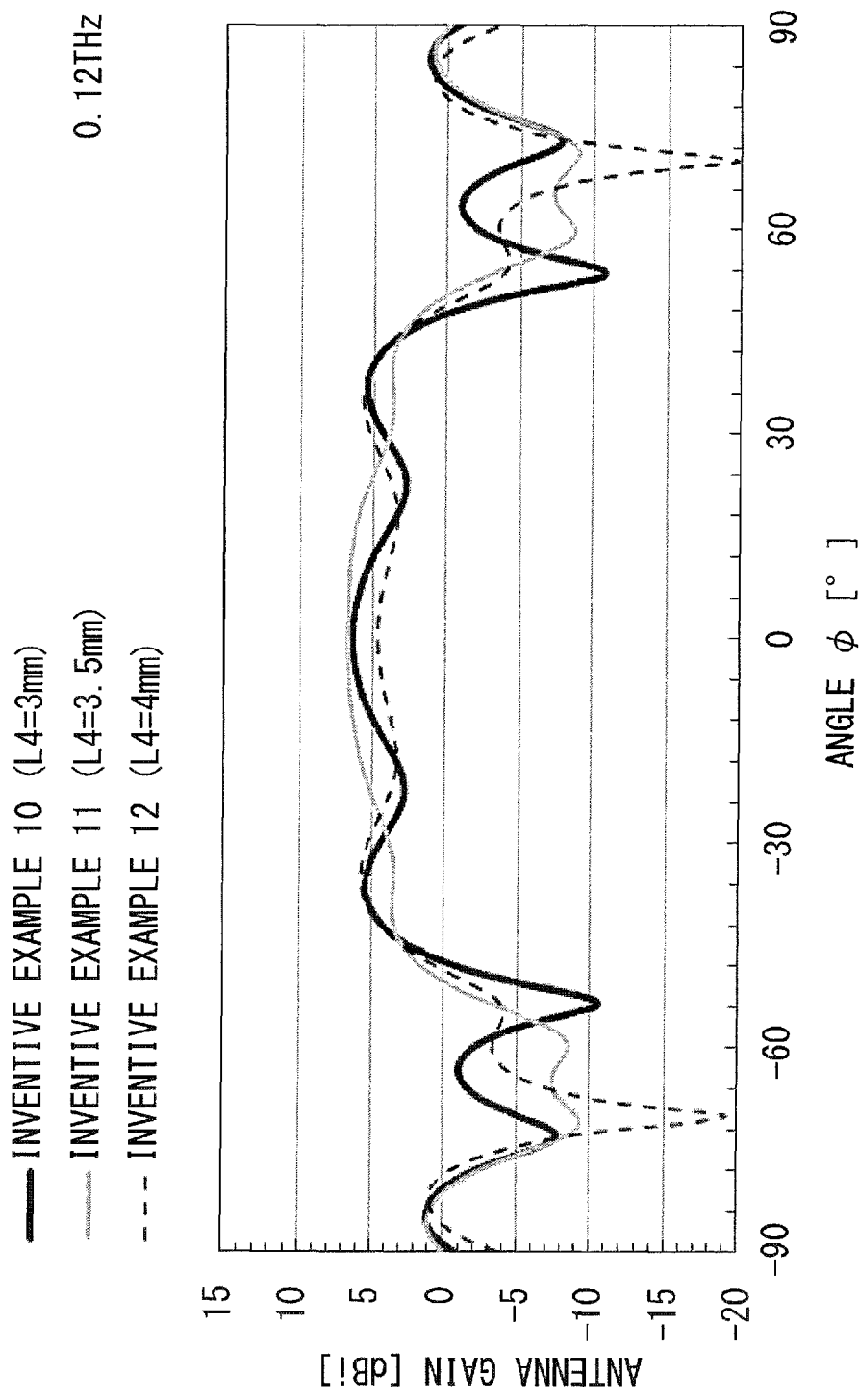
FIG. 28 is a diagram showing the simulation results of the antenna gain obtained at the time of transmission of the electromagnetic wave of 0.12 THz.

FIGS. 25 and 26 are diagrams showing the simulation results of the antenna gain at the time of transmission of the electromagnetic wave of 0.30 THz. FIGS. 27 and 28 are diagrams showing the simulation results of the antenna gain at the time of transmission of the electromagnetic wave of 0.12 THz. In FIGS. 25 and 27, the simulation results in the inventive example 6 to the inventive example 9 are shown. In FIGS. 26 and 28, the simulation results in the inventive examples 10 to 12 are shown. In FIGS. 25 to 28, the ordinates indicate the antenna gain [dBi], and the abscissas indicate the azimuth angle φ. Regarding the simulation results of FIGS. 25 to 28, difference from the simulation results (FIGS. 15 and 16) of the antenna gain in the inventive example 1 will be described.

At the time of transmission of the electromagnetic wave of 0.30 THz, two peaks of the antenna gain appear in a range of the azimuth angle φ from minus 30° to 0° and in a range of azimuth angle φ from 0° to plus 30° to be substantially symmetrical with respect to a direction in which the azimuth angle φ is 0°. The antenna gain in the direction in which the azimuth angle φ is 0° in the inventive examples 11, 10, 9, 8, 7 and 6 increases in this order. That is, the smaller the distance L4 (FIG. 23) from the end surfaces 23a, 23b to the slits SL1, SL2 of the electrodes 20a, 20b is, the higher the antenna gain in the direction in which the azimuth angle is 0° is. On the other hand, in the inventive example 12, the antenna gain reaches its maximum in the direction in which the azimuth angle φ is about 0°.

At the time of transmission of the electromagnetic wave of 0.12 THz, the antenna gain is substantially constant in a range in which the azimuth angle φ is from about minus 30° to about plus 30° in the inventive example 6 as shown in FIG. 27. In the inventive example 7, the relatively high peaks of the antenna gain respectively appear in directions in which the azimuth angles φ are about minus 30° and about plus 30°, and the relatively low peak of the antenna gain appear in a direction in which the azimuth angle φ is 0°. In the inventive example 8, the antenna gain reaches its maximum in the direction in which the azimuth angle φ is 0°. In the inventive example 9, the antenna gain is substantially constant in a range in which the azimuth angle φ is from about minus 20° to about plus 20°.

Further, as shown in FIG. 28, in the inventive example 10, the peaks of the antenna gain that are substantially the same respectively appear in directions in which the azimuth angle φ are about minus 40°, 0° and about plus 40°. In the inventive example 11, the antenna gain reaches its maximum in the direction in which the azimuth angle φ is 0°. In the inventive example 12, the relatively high peaks of the antenna gain respectively appear in the directions in which the azimuth angle φ is about minus 40° and about plus 40°, and the relatively low peak of the antenna gain appears in the direction in which the azimuth angle φ is 0°.

In this manner, in the inventive examples 6 to 12 the equivalent antenna gain is obtained in a relatively wide range of the azimuth angle φ. That is, the electromagnetic wave can be transmitted in a relatively wide range of the azimuth angle φ.

(2-2) Effects of Second Embodiment

In this manner, also in the antenna module 1 according to the second embodiment, the transfer of the signal SG from the regions R2a, R2b to the regions R1a, R1b of the electrodes 20a, 20b is blocked by the slits SL1, SL2 similarly to the above-mentioned first embodiment. Thus, the frequency band in which the transmission characteristics are deteriorated is shifted to a higher region. Further, the frequency bands in which the transmission characteristics are deteriorated are different depending on the positions of the slits SL1, SL2. Thus, the positions of the slits SL1, SL2 are adjusted, whereby the frequency band in which the transmission characteristics are deteriorated can be adjusted. Therefore, deterioration of the transmission characteristics of the signal SG in a desired frequency band can be suppressed.

(3) Third Embodiment

Figure 29:
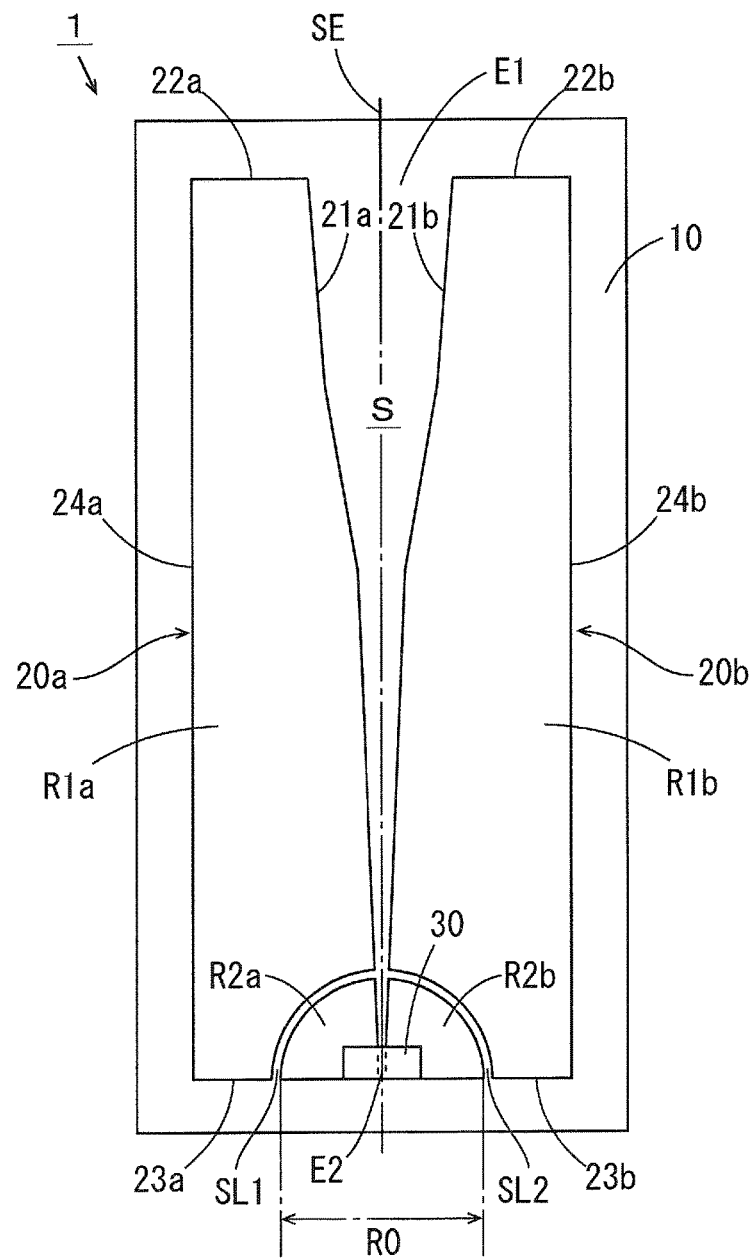
FIG. 29 is a schematic plan view of the antenna module according to the third embodiment of the present embodiment.

FIG. 29 is a schematic plan view of the antenna module 1 according to the third embodiment of the present invention. Regarding the antenna module 1 of FIG. 29, difference from the antenna module 1 according to the above-mentioned first embodiment will be described.

In the antenna module 1 of FIG. 29, the slits SL1, SL2 are provided to respectively extend in a curved line from the side surfaces 21a, 21b to the end surfaces 23a, 23b of the electrodes 20a, 20b. The slits SL1, SL2 are formed to be symmetrical with each other with respect to the central axis SE of the tapered slot S. Further, the slits SL1, SL2 are respectively formed to extend along a circle with the mount end E2 used as a center.

(3-1) Characterization of Antenna Module

The characteristics of the antenna module 1 according to the third embodiment were evaluated by the simulation.

(a) Inventive Examples 13 to 16

Except that the slits SL1, SL2 are formed as shown in FIG. 29, the antenna module 1 of the inventive examples 13 to 16 has the same configuration as the antenna module 1 of the inventive example 1 and is connected to the circuit board 50 by the wire connection similarly to the antenna module 1 of the inventive example 1.

In the inventive example 13, the slits SL1, SL2 extend along a circle having a diameter R0 (FIG. 29) that is 0.5 mm. In the inventive example 14, the slit SL1, SL2 extend along a circle having the diameter R0 that is 1 mm. In the inventive example 15, the slits SL1, SL2 extend along a circle having the diameter R0 that is 2 mm. In the inventive example 16, the slits SL1, SL2 extend along a circle having the diameter R0 that is 3 mm. In the inventive example 16, the diameter R0 is larger than the total length of the end surfaces 23a, 23b in the width direction. Therefore, the one end of the slit SL1 and the one end of the slit SL2 are positioned at the side surfaces 24a, 24b, not the end surfaces 23a, 23b.

(b) Transmission Characteristics

Figure 30:
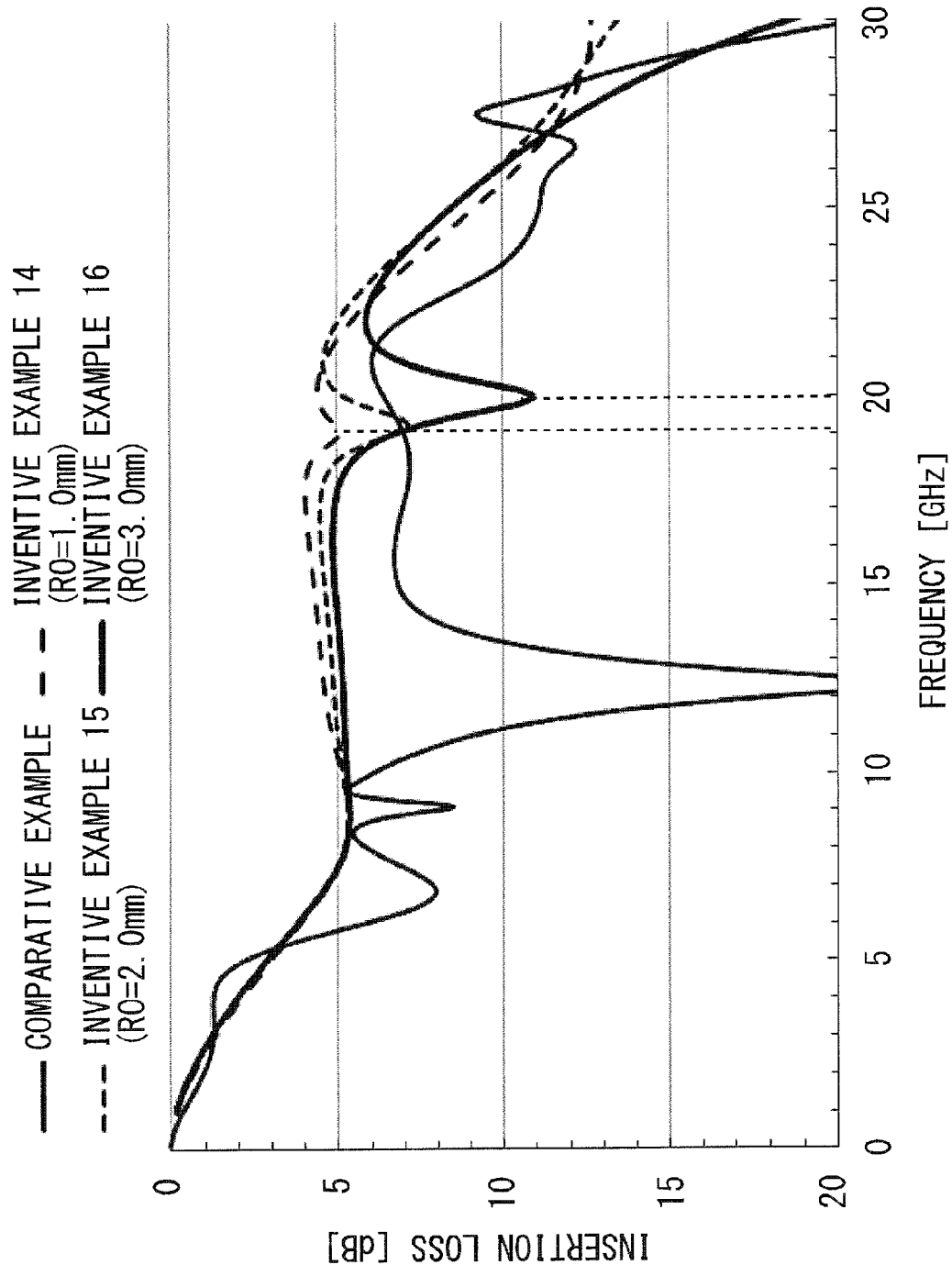
FIG. 30 is a diagram showing the simulation results of the transmission characteristics.
Figure 31:
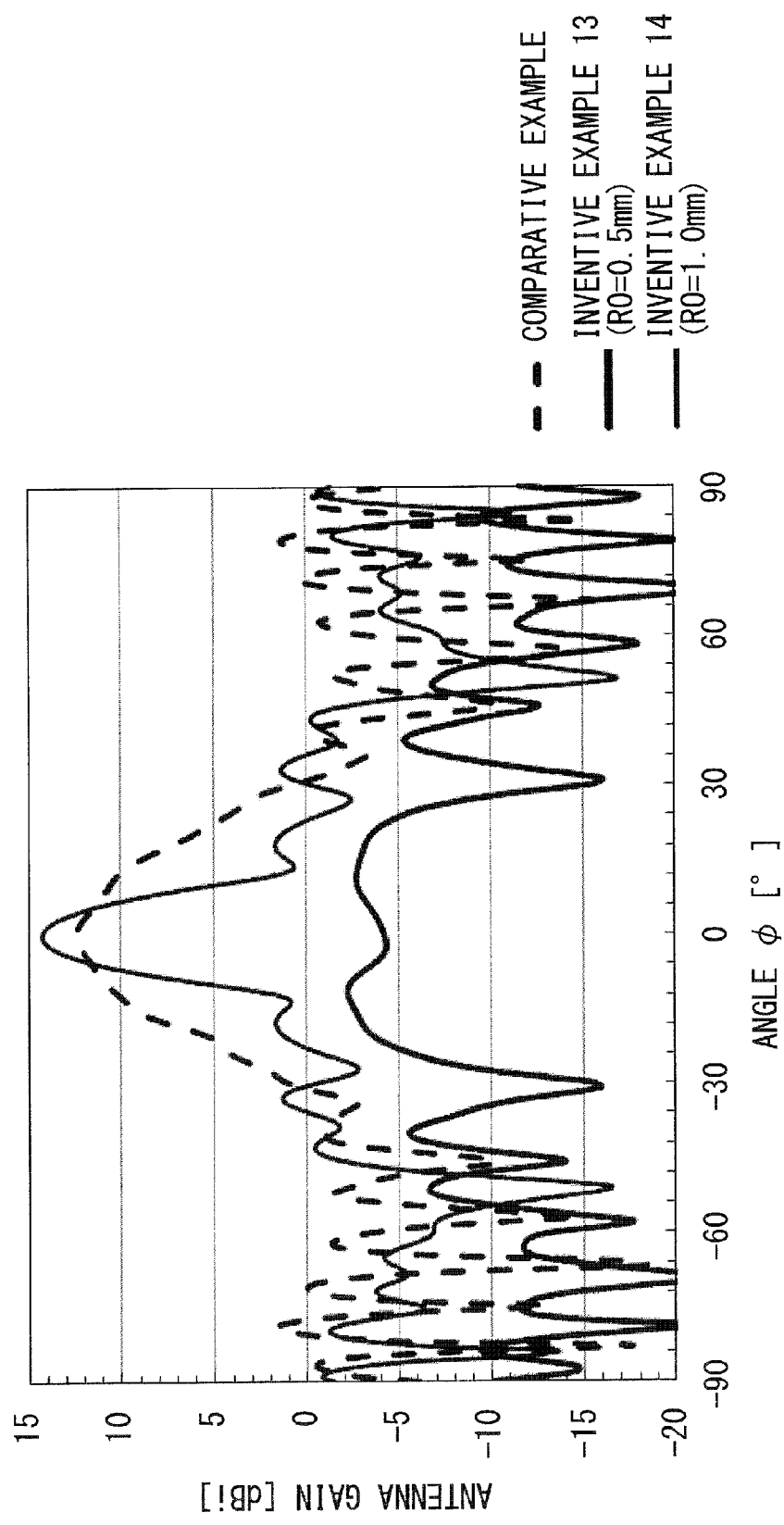
FIG. 31 is a diagram showing the simulation results of the antenna gain obtained at the time of transmission of the electromagnetic wave of 0.30 THz.
Figure 32:
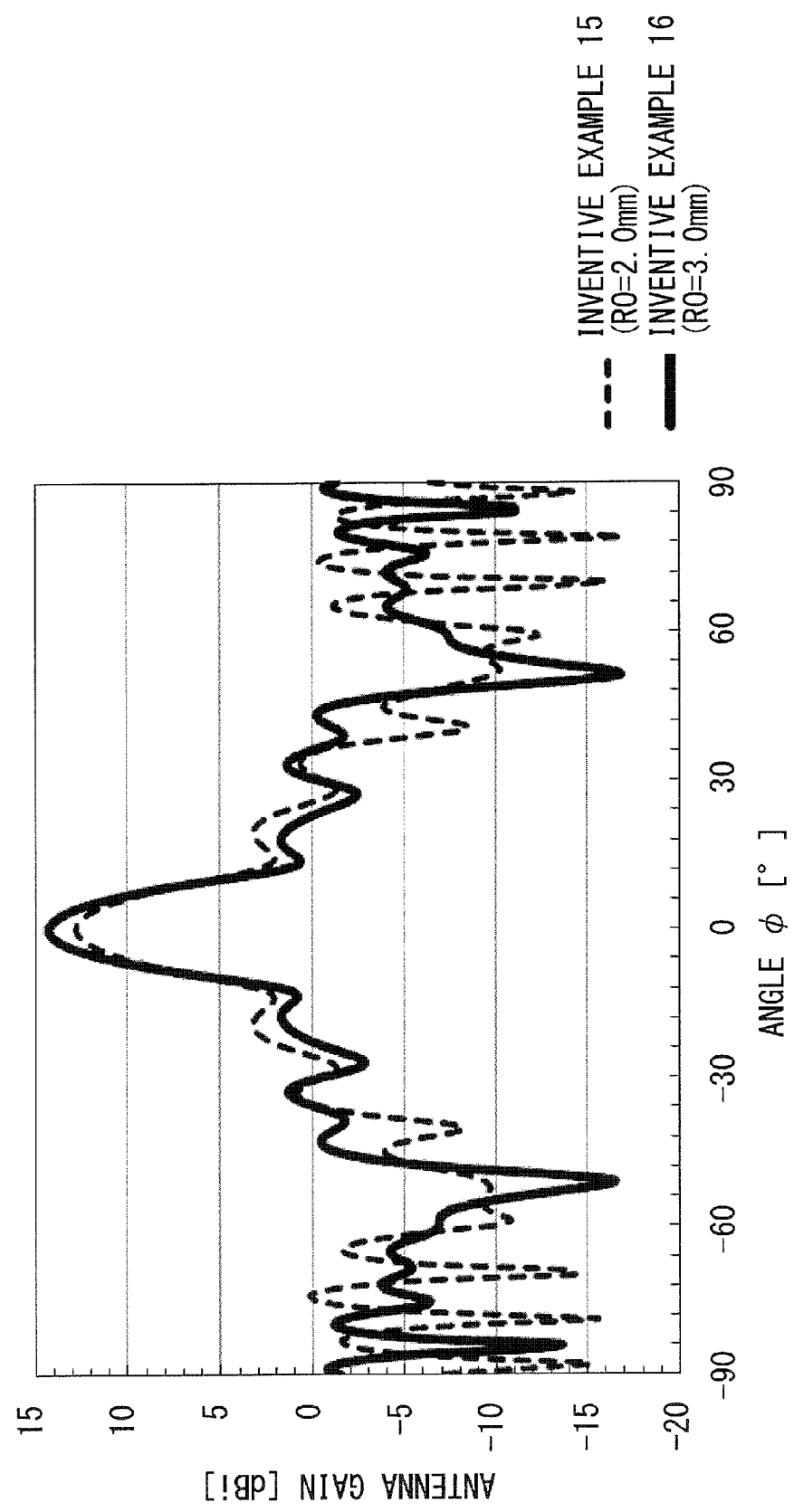
FIG. 32 is a diagram showing the simulation results of the antenna gain obtained at the time of transmission of the electromagnetic wave of 0.30 THz.
Figure 33:
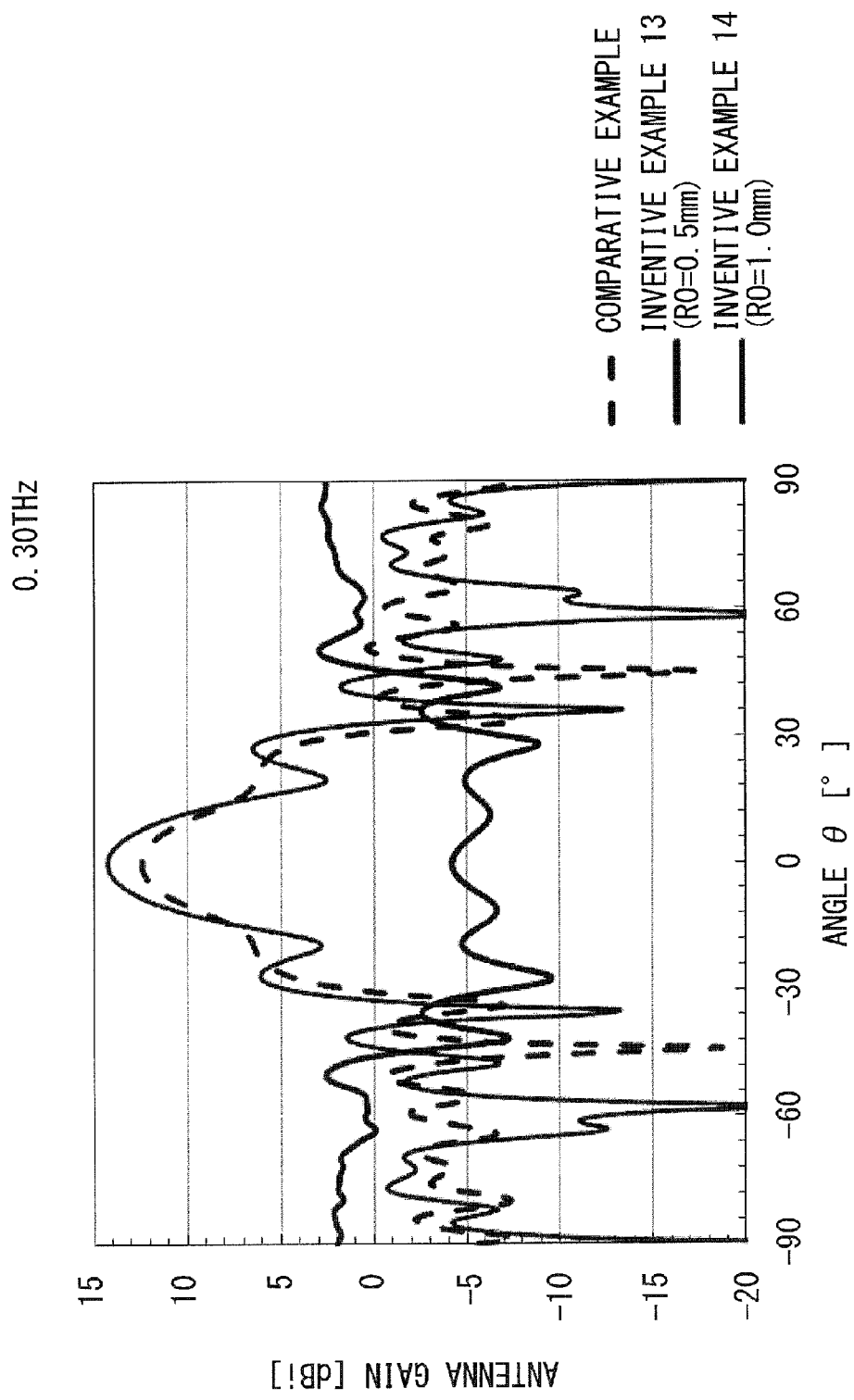
FIG. 33 is a diagram showing the simulation results of the antenna gain obtained at the time of transmission of the electromagnetic wave of 0.30 THz.
Figure 34:
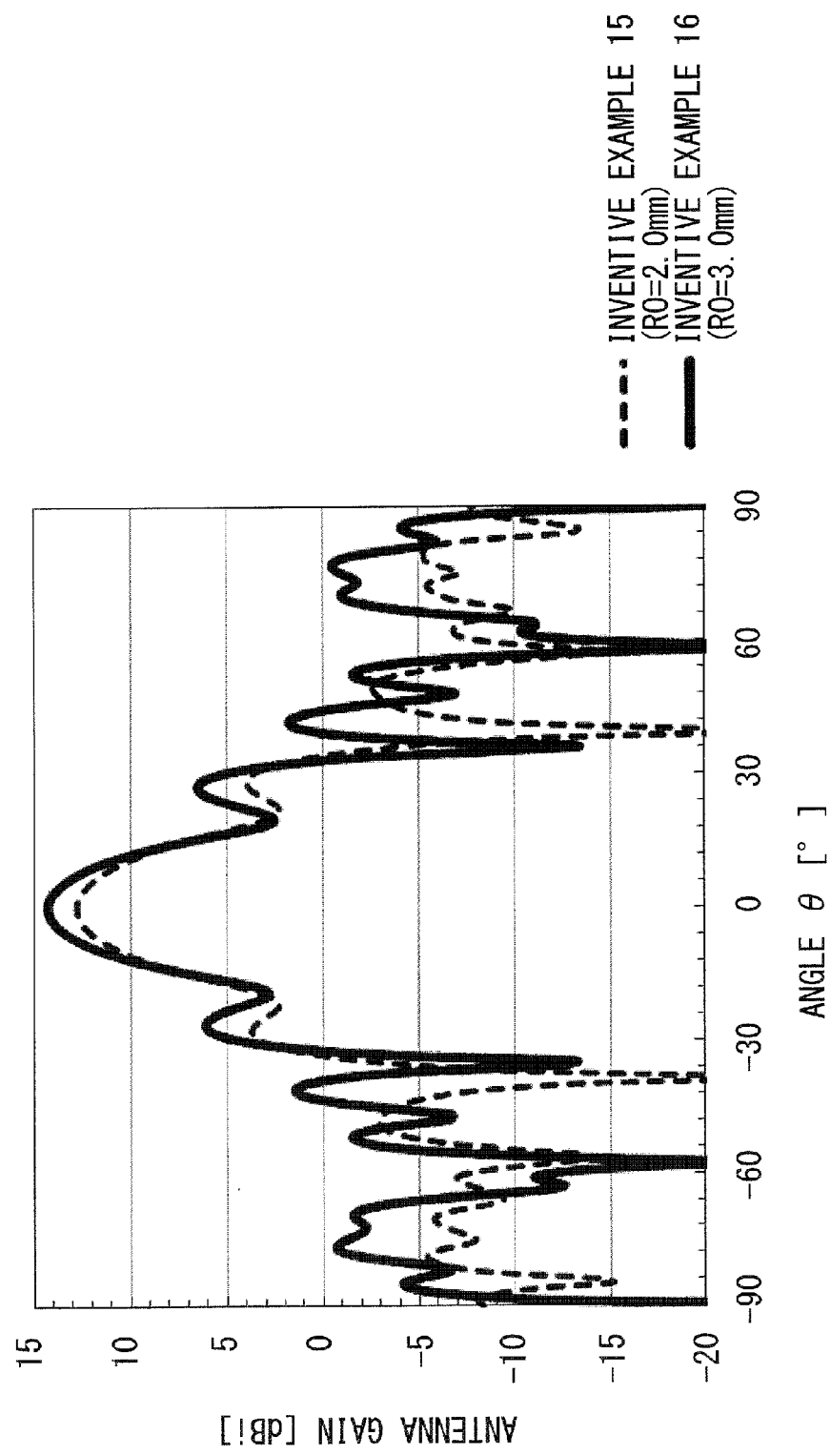
FIG. 34 is a diagram showing the simulation results of the antenna gain obtained at the time of transmission of the electromagnetic wave of 0.30 THz.
Figure 35:
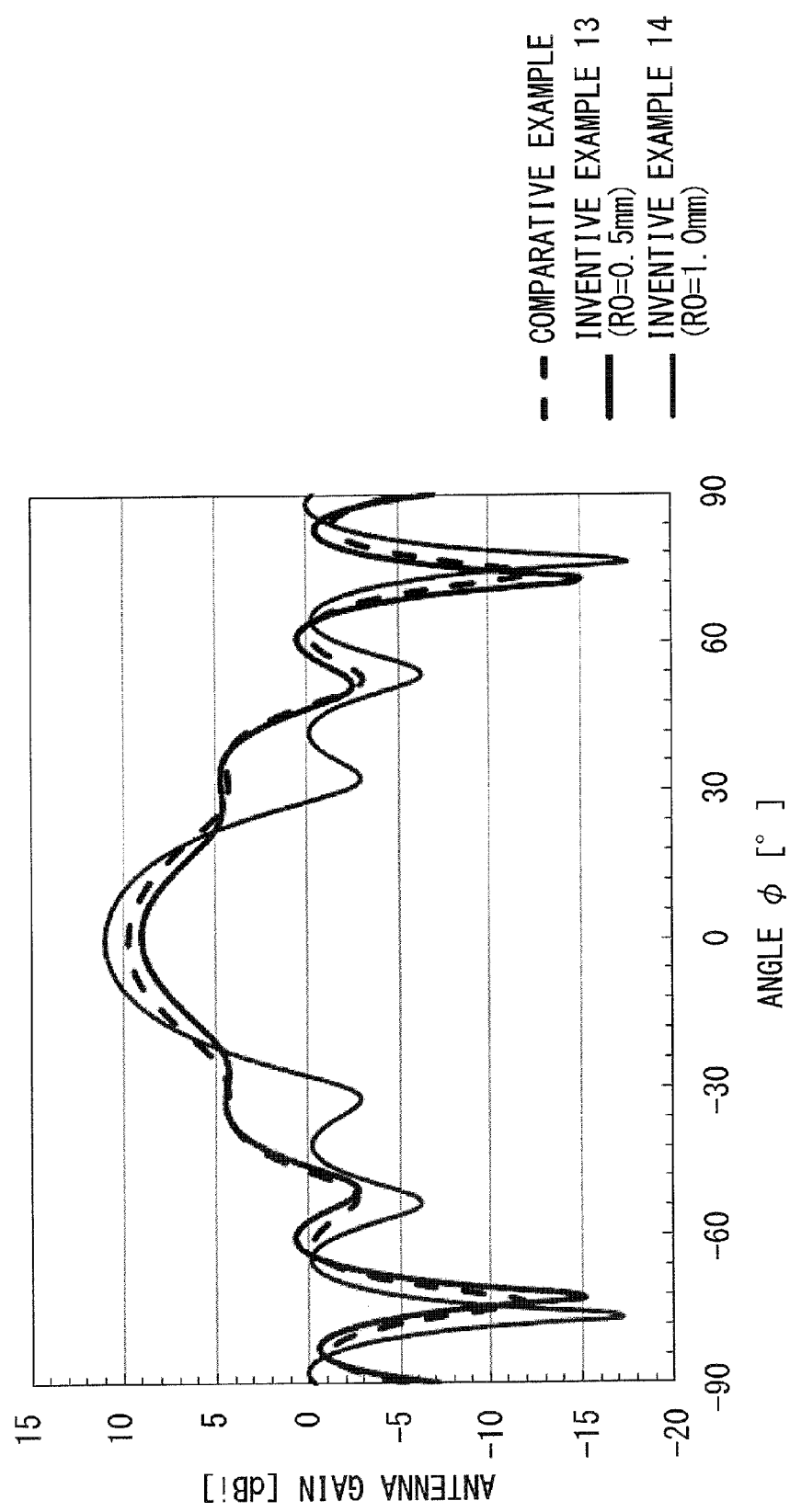
FIG. 35 is a diagram showing the simulation results of the antenna gain obtained at the time of transmission of the electromagnetic wave of 0.12 THz.
Figure 36:
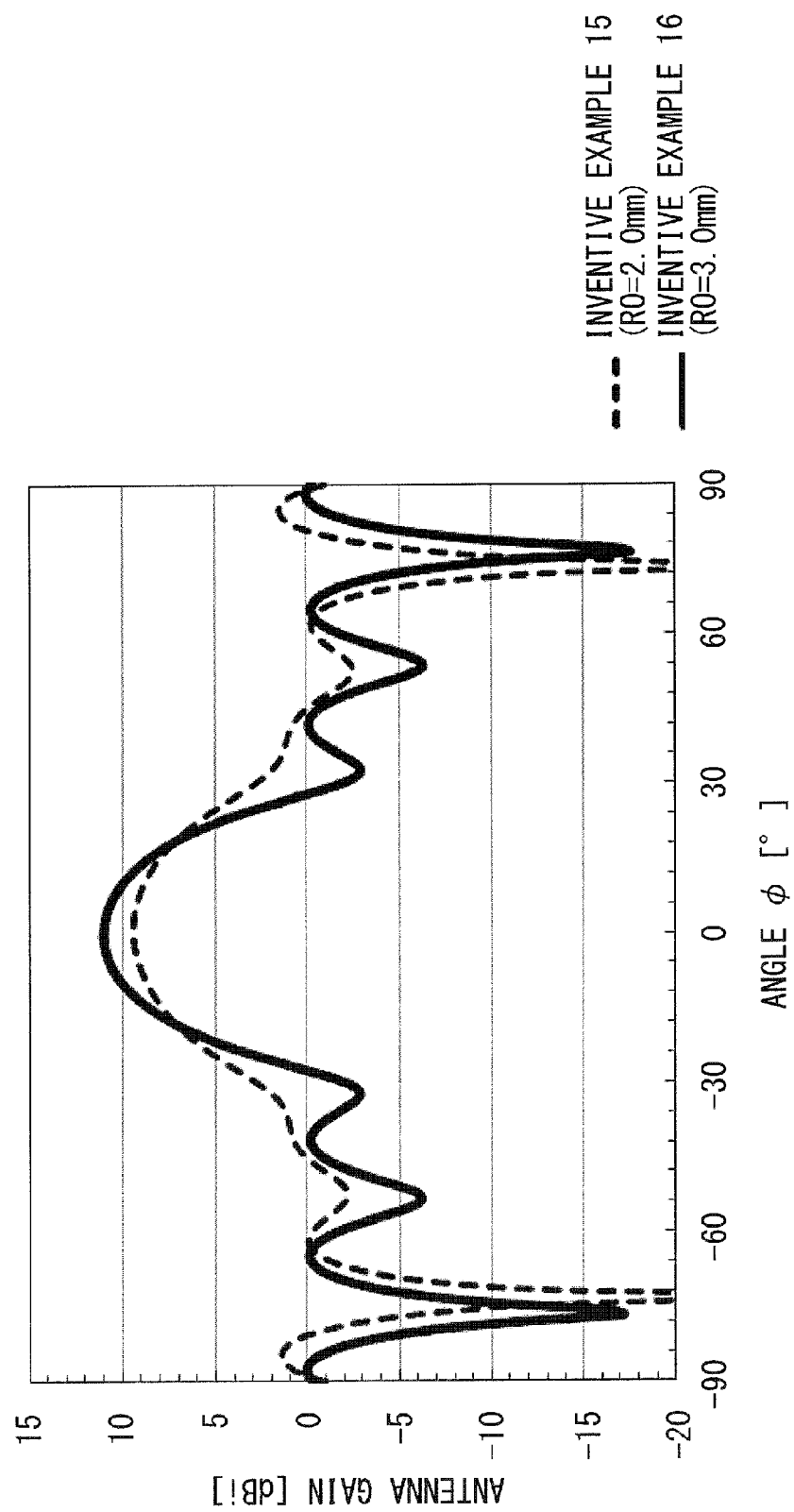
FIG. 36 is a diagram showing the simulation results of the antenna gain obtained at the time of transmission of the electromagnetic wave of 0.12 THz.
Figure 37:
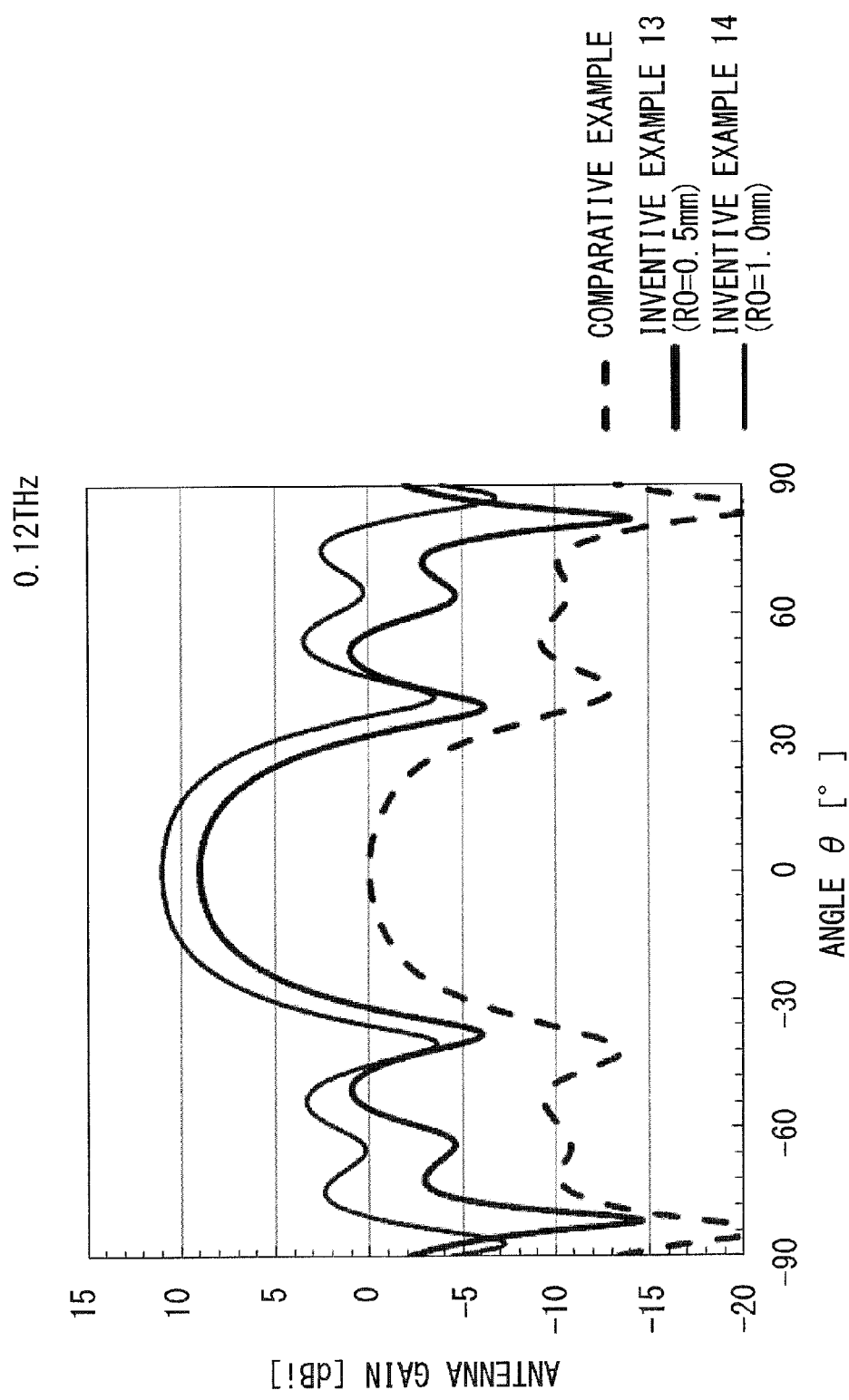
FIG. 37 is a diagram showing the simulation results of the antenna gain obtained at the time of transmission of the electromagnetic wave of 0.12 THz.
Figure 38:
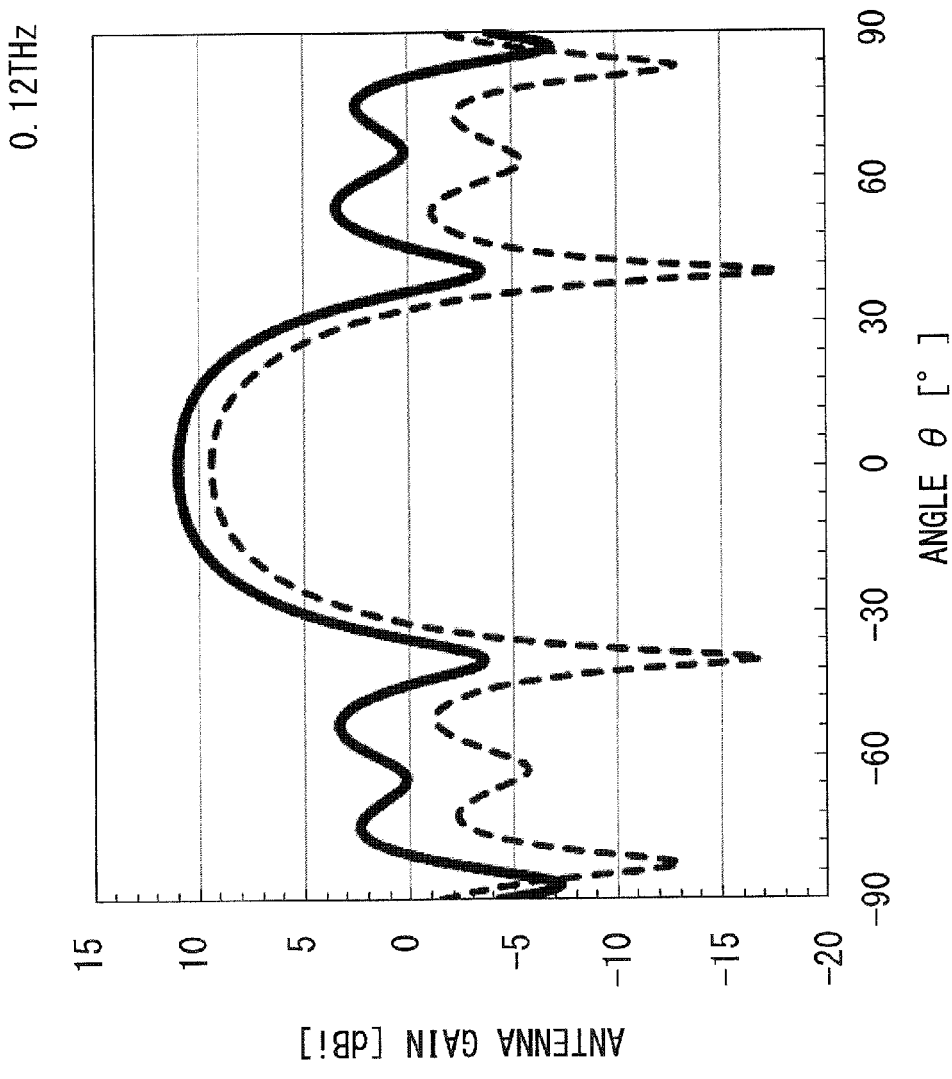
FIG. 38 is a diagram showing the simulation results of the antenna gain obtained at the time of transmission of the electromagnetic wave of 0.12 THz.

Regarding the antenna module 1 of the inventive examples 14 to 16, the transmission characteristics (the pass characteristics) of the signal were found by the electromagnetic field simulation. FIG. 30 is a diagram showing the simulation results of the transmission characteristics. In FIG. 30, the simulation results of the transmission characteristics in the above-mentioned comparative example are shown for comparison. In FIG. 30, the ordinate indicates the insertion loss [dB], and the abscissa indicates the frequency [GHz] of the transmitted signal (the base band signal). Regarding the simulation results of FIG. 30, difference from the simulation results of the transmission characteristics in the inventive example 1 will be described.

As shown in FIG. 30, in the inventive example 14, the peak of the insertion loss appears in the frequency band around 19 GHz, and the insertion loss increases to about 5.1 dB. In the inventive example 15, the peak of the insertion loss appears in the frequency band around 19 GHz, and the insertion loss increases to about 7.1 dB. In the inventive example 16, the peak of the insertion loss appears in the frequency band around 20 GHz, and the insertion loss increases to about 10.9 dB.

In any of the inventive examples 14 to 16, the transmission characteristics are kept high in the frequency band of not more than about 18 GHz. Further, the smaller the diameter R0 of a circle that extends along the slits SL1, SL2 is, the lower the peak value of the insertion loss is. On the other hand, the larger the diameter R0 of a circle that extends along the slits SL1, SL2 is, the higher the frequency band in which the peak of the insertion loss appears is.

(c) Antenna Gain of Antenna Module

Regarding the antenna module 1 of the above-mentioned inventive examples 13 to 16, the antenna gain obtained at the time of transmission operation was found by the electromagnetic field simulation.

FIGS. 31 to 34 are diagrams showing the simulation results of the antenna gain at the time of transmission of the electromagnetic wave of 0.30 THz. FIGS. 35 to 38 are diagrams showing the simulation results of the antenna gain at the time of transmission of the electromagnetic wave of 0.12 THz. In FIGS. 31, 32, 35 and 36, the ordinates indicate the antenna gain [dBi], and the abscissas indicate the azimuth angle φ. In FIGS. 33, 34, 37 and 38, the ordinates indicate the antenna gain [dBi], and the abscissas indicate the elevation angle θ.

In FIGS. 31, 33, 35 and 37, the simulation results in the inventive examples 13 and 14, and the simulation results in the comparative example are shown. In FIGS. 32, 34, 36 and 38, the simulation results in the inventive examples 15 and 16 are shown. Regarding the simulation results of FIGS. 31 to 38, difference from the simulation results (FIGS. 15 and 16) of the antenna gain in the inventive example 1 will be described.

At the time of transmission of the electromagnetic wave of 0.30 THz, as shown in FIGS. 31 to 34, the antenna gain reaches its maximum in a direction in which the azimuth angle φ and the elevation angle θ are 0° in the inventive examples 14 to 16. The maximum values of the antenna gain in the inventive examples 14 to 16 are higher than the maximum value of the antenna gain in the comparative example.

On the other hand, two peaks of the antenna gain appear in a range in which the azimuth angle φ is from minus 30° to 0°, and in a range in which the azimuth angle φ is from 0° to plus 30° to be substantially symmetrical with respect to the direction in which the azimuth angle φ is 0° in the inventive example 13. Further, the peaks of the antenna gain that are substantially the same magnitude respectively appear in directions in which the elevation angle θ is about minus 20°, 0° and about plus 20° in the inventive example 13. The maximum value of the antenna gain in the inventive example 13 is lower than the maximum value of the antenna gain in the comparative example.

At the time of transmission of the electromagnetic wave of 0.30 THz, the maximum value of the antenna gain in the inventive example 13 is about minus 2.2 dBi, the maximum value of the antenna gain in the inventive example 14 is about 14.3 dBi, the maximum value of the antenna gain in the inventive example 15 is about 12.8 dBi and the maximum value of the antenna gain in the inventive example 16 is about 14.3 dBi.

Thus, it is found that the directivity and the antenna gain of the antenna module 1 increases in a range in which the diameter R0 of the circle that extends along the slits SL1, SL2 is not less than 1.0 mm and not more than 3.0 mm, at the time of transmission of the electromagnetic wave of 0.30 THz.

At the time of transmission of the electromagnetic wave of 0.12 THz, the antenna gain reaches its maximum in a direction in which the azimuth angle φ and the elevation angle 8 are 0° in the inventive examples 13 to 16 as shown in FIGS. 35 to 38. The maximum values of the antenna gain in the inventive examples 14 and 16 are higher than the maximum values of the antenna gain in the comparative example, and the maximum values of the antenna gain in the inventive examples 13 and 15 are lower than the maximum value of the antenna gain in the comparative example.

At the time of transmission of the electromagnetic wave of 0.12 THz, the maximum value of the antenna gain in the inventive example 13 is about 9.0 dBi, the maximum value of the antenna gain in the inventive example 14 is about 11.0 dBi, the maximum value of the antenna gain in the inventive example 15 is about 9.4 dBi and the maximum value of the antenna gain in the inventive example 16 is about 11.0 dBi.

Thus, it is found that the directivity of the antenna module 1 and the antenna gain increase in a range in which the diameter R0 of the circle that extends along the slits SL1, SL2 is not less than 0.5 mm and not more than 3.0 mm, at the time of transmission of the electromagnetic wave of 0.12 THz.

(3-2) Effects of Third Embodiment

In this manner, even in the antenna module 1 according to the third embodiment, the transfer of the signal SG from the regions R2a, R2b to the regions R1a, R1b of the electrodes 20a, 20b is blocked by the slits SL1, SL2 similarly to the first embodiment. Thus, the frequency band in which the transmission characteristics are deteriorated is shifted to a higher region. Further, the frequency bands in which the transmission characteristics are deteriorated are different depending on the positions of the slits SL1, SL2. Thus, it is possible to adjust the frequency band in which the transmission characteristics are deteriorated by adjusting the positions of the slit SL1, SL2. Therefore, deterioration of the transmission characteristics of the signal SG in a desired frequency band can be suppressed.

(4) Other Embodiments (4-1)

Figure 39:
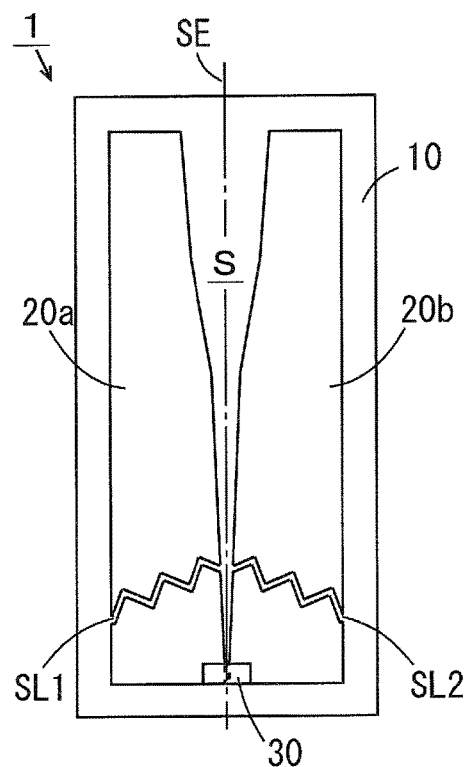
FIGS. 39(a) and 39(b) are diagrams showing the examples of other shapes of a slit.
Figure 39:
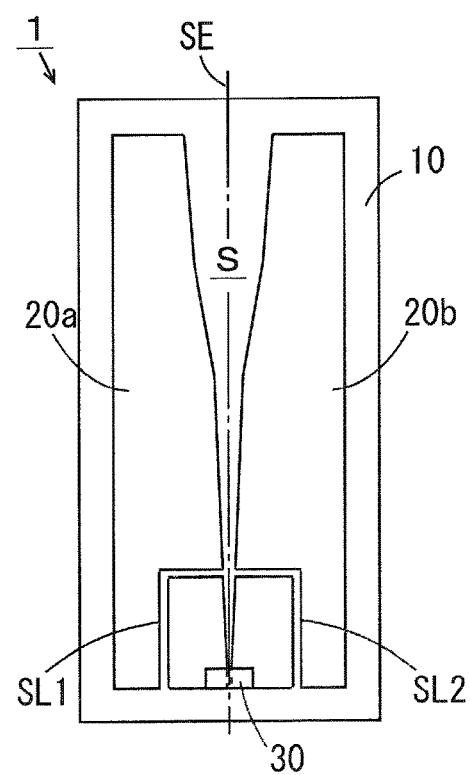

While the slits SL1, SL2 are formed linearly or in a circular arc shape in the above-mentioned embodiment, the present invention is not limited to this. FIGS. 39(a) and 39(b) are diagrams showing another example of the slits SL1, SL2.

In the example of FIG. 39(a), the slits SL1, SL2 are formed in a saw shape. In the example of FIG. 39(b), the slits SL1, SL2 are formed to vertically extend to the central axis SE of the tapered slot S from the side surfaces 21a, 21b of the electrodes 20a, 20b and to vertically further extend to the end surfaces 23a, 23b.

Even in these examples, the transfer of the signal SG from the regions R2a, R2b to the regions R1a, R1b of the electrodes 20a, 20b is blocked, and the frequency band in which the transmission characteristics are deteriorated is shifted to a higher region. Further, it is possible to adjust the frequency band in which the transmission characteristics are deteriorated by adjusting the positions, the widths and the shapes of the slits SL1, SL2. Therefore, deterioration of the transmission characteristics of the signal SG in a desired frequency band can be suppressed.

As yet another example of the slits SL1, SL2, the slits SL1, SL2 may be formed in parallel to the central axis SE of the tapered slot S, or a plurality of sets of the slits SL1, SL2 may be respectively formed.

(4-2)

While the widths of the slits SL1, SL2 are set to be constant in the above-mentioned embodiment, the present invention is not limited to this. If the transmission and the reception of the electromagnetic wave can be appropriately performed, the widths of the slits SL1, SL2 do not have to be constant.

(4-3)

Figure 40:
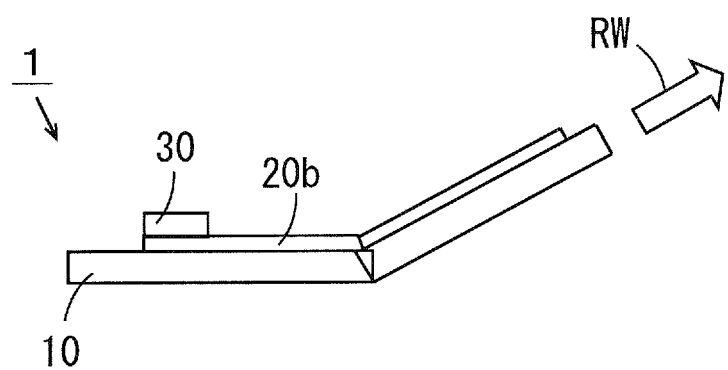
FIG. 40 is a schematic side view showing the example in which a base layer is bent.

The antenna module 1 may be used with the base layer 10 being bent. FIG. 40 is a schematic side view showing an example of the base layer 10 that is bent.

In a case in which a flexible material is used as the material for the base layer 10 of the antenna module 1, the antenna module 1 can be bent along an axis that intersects with the central axis direction. Thus, as shown in FIG. 40, the radiation direction of the electromagnetic wave RW can be changed to any direction.

(4-4)

While the slits SL1, SL2 are provided to be symmetrical with each other with respect to the central axis SE of the tapered slot S in the above-mentioned embodiment, the present invention is not limited to this. The slits SL1, SL2 do not have to be symmetrical with each other with respect to the central axis SE of the tapered slot S depending on the application and the like of the antenna module 1. Further, the slits SL1, SL2 may have different shapes from each other. In this case, the directivity of the antenna module 1 can be changed.

(4-5)

While the one pair of electrodes 20a, 20b is provided at the main surface of the base layer 10 in the above-mentioned embodiment, the present invention is not limited to this. For example, the electrodes 20a, 20b may further be provided at the back surface of the base layer 10, or the plurality of pairs of electrodes 20a, 20b may be provided at the main surface and the back surface of the base layer 10.

(4-6)

While the semiconductor device 30 is mounted on the main surface of the base layer 10 in the above-mentioned embodiment, the present invention is not limited to this. The semiconductor device 30 may be mounted on the back surface of the base layer 10, or the plurality of semiconductor devices 30 may be respectively mounted on the main surface and the back surface of the base layer 10. For example, the electrode may be formed on the main surface of the base layer 10, and the semiconductor device 30 may be mounted on the back surface of the base layer 10.

(5) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the antenna module 1 is an example of an antenna module, the base layer 10 is an example of a base layer, the electrodes 20*a*, 20*b* are examples of an electrode, the semiconductor device 30 is an example of a semiconductor device, the electrode 20*a* is an example of a first conductor layer, the electrode 20*b* is an example of a second conductor layer, the tapered slot S is an example of an opening, the region R2*a* is an example of a first device connection portion, the region R1*a* is an example of a first antenna portion, the slit SL1 is an example of a first slit, the region R2*b* is an example of a second device connection portion, the region R1*b* is an example of a second antenna portion and the slit SL2 is an example of a second slit. Further, the side surface 21*a* is an example of a first side surface, the side surface 21*b* is an example of a second side surface, the end surface 23*a* is an example of a first end surface and the end surface 23*b* is an example of a second end surface.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of antenna modules.

We claim:

1. An antenna module comprising:
an insulative base layer that has first and second surfaces;
an electrode formed on at least one surface of the first and second surfaces of the base layer to be capable of receiving or transmitting an electromagnetic wave in a terahertz band; and
a semiconductor device that is mounted on at least one surface of the first and second surfaces of the base layer to be electrically connected to the electrode, and is operable in the terahertz band; wherein
the electrode includes first and second conductor layers that constitute a tapered slot antenna having an opening,
the opening has a width that decreases continuously or gradually from one end to another end of a set of the first and second conductor layers,
a first slit is formed at the first conductor layer such that the first conductor layer is divided into a first device connection portion that is positioned at the other end of the first conductor layer and is electrically connected to the semiconductor device, and a first antenna portion that is not electrically connected to the semiconductor device, and
a second slit is formed at the second conductor layer such that the second conductor layer is divided into a second device connection portion that is positioned at the other end of the second conductor layer and is electrically connected to the semiconductor device, and a second antenna portion that is not electrically connected to the semiconductor device, wherein the second device connection portion is spaced apart from the first device connection portion,
wherein the first conductor layer has a first side surface and the second conductor layer has a second side surface, the first and second side surfaces being opposite to each other,
wherein the opening is a gap between the first side surface and the second side surface,
wherein the first conductor layer has a first end surface substantially perpendicular to a central axis of the opening,
wherein the second conductor layer has a second end surface substantially perpendicular to the central axis of the opening,
wherein the first slit is formed to extend from the first side surface to the first end surface of the first conductor layer, and
wherein the second slit is formed to extend from the second side surface to the second end surface of the second conductor layer.

2. The antenna module according to claim 1, wherein the first and second slits are formed to be symmetrical with respect to a central axis of the opening.

3. The antenna module according to claim 1, wherein the first device connection portion has an area smaller than the first antenna portion, and the second device connection portion has an area smaller than the second antenna portion.

4. The antenna module according to claim 1, wherein the first and second slits are linearly formed.

5. The antenna module according to claim 1, wherein
the first slit is formed in a curved line such that an angle of the first slit with a central axis of the opening is gradually reduced from the first side surface of the conductor layer, and
the second slit is formed in a curved line such that an angle of the second slit with a central axis of the opening is gradually reduced from the second side surface of the second conductor layer.

6. The antenna module according to claim 1, wherein the base layer is a dielectric film made of resin.

7. A method for manufacturing an antenna module comprising the steps of:
forming an electrode on at least one surface of the first and second surfaces of the insulative base layer to be capable of receiving or transmitting an electromagnetic wave in a terahertz band; and
mounting a semiconductor device operable in a terahertz band on at least one surface of the first and second surfaces of the base layer to be electrically connected to the electrode, wherein
the electrode includes first and second conductor layers that constitute a tapered slot antenna having an opening,
the first conductor layer has a first side surface and the second conductor layer has a second side surface, the first and second side surfaces being opposite to each other,
the first conductor layer has a first end surface substantially perpendicular to a central axis of the opening and the second conductor layer has a second end surface substantially perpendicular to the central axis of the opening,
the opening has a width that decreases continuously or gradually from one end to another end of a set of the first and second conductor layers, the opening being a gap between the first side surface and the second side surface, a first slit is formed at the first conductor layer such that the first conductor layer is divided into a first device connection portion that is positioned at the other end of the first conductor layer and is electrically connected to the semiconductor device, and a first antenna portion that is not electrically connected to the semiconductor device, the first slit being formed to extend from the first side surface to the first end surface of the first conductor layer, and a second slit is formed at the second conductor layer such that the second conductor layer is divided into a second device connection portion that is positioned at the other end of the second conductor layer and is electrically connected to the semiconductor device, and a second antenna portion that is not electrically connected to the semiconductor device, wherein the second device connection portion is spaced apart from the first device connection portion, the second slit being formed to extend from the second side surface to the second end surface of the second conductor layer.

\* \* \* \* \*